(12) United States Patent
Murphy et al.

(10) Patent No.: US 11,758,041 B2
(45) Date of Patent: Sep. 12, 2023

(54) CALL CONTENT MANAGEMENT FOR MOBILE DEVICES

(71) Applicant: FIRST ORION CORP., North Little Rock, AR (US)

(72) Inventors: Brandon Wayne Murphy, Little Rock, AR (US); Benjamin Michael Lavigne, Little Rock, AR (US); Murtuza Qutbuddin Saifee, Dubai (AE); Scott Dennis Hambuchen, Little Rock, AR (US); Robert Collin Seely, Little Rock, AR (US)

(73) Assignee: FIRST ORION CORP., North Little Rock, AR (US)

( * ) Notice: Subject to any disclaimer, the term of this patent is extended or adjusted under 35 U.S.C. 154(b) by 58 days.

(21) Appl. No.: 17/156,488

(22) Filed: Jan. 22, 2021

(65) Prior Publication Data

US 2021/0144246 A1   May 13, 2021

Related U.S. Application Data

(63) Continuation-in-part of application No. 16/298,640, filed on Mar. 11, 2019.

(60) Provisional application No. 62/715,677, filed on Aug. 7, 2018.

(51) Int. Cl.
| | |
|---|---|
| *H04M 3/42* | (2006.01) |
| *H04W 4/16* | (2009.01) |
| *H03M 3/00* | (2006.01) |

(52) U.S. Cl.
CPC ....... *H04M 3/42042* (2013.01); *H03M 3/436* (2013.01); *H04M 3/42059* (2013.01); *H04W 4/16* (2013.01)

(58) Field of Classification Search
CPC ............ H04M 3/42042; H04M 3/436; H04M 3/42068; H04M 3/42059; H04M 3/42102; H04W 4/16
See application file for complete search history.

(56) References Cited

U.S. PATENT DOCUMENTS

| | | | |
|---|---|---|---|
| 7,864,940 B1 | 1/2011 | Harvey et al. | |
| 8,090,840 B2 | 1/2012 | Jackson | |
| 10,694,035 B2 | 6/2020 | Knuth et al. | |
| 10,897,536 B2 | 1/2021 | Knuth et al. | |
| 11,522,996 B2 | 12/2022 | Knuth et al. | |
| 2003/0147378 A1 | 8/2003 | Glasser et al. | |
| 2005/0041793 A1 | 2/2005 | Fulton et al. | |
| 2005/0073999 A1* | 4/2005 | Koch ................ | H04M 3/42042 370/352 |
| 2005/0084084 A1 | 4/2005 | Cook et al. | |

(Continued)

OTHER PUBLICATIONS

Extended European Search Report issued in the corresponding EP Application No. 19846371.3, dated Aug. 20, 2021.

*Primary Examiner* — Margaret G Mastrodonato

(57) ABSTRACT

One example method of operation may include one or more of identifying a calling device number of a calling device, matching the calling device number with one or more of a plurality of enhanced call content profiles, selecting, based on a call identifier, one of the enhanced call content profiles comprising enhanced call content intended for one or more call recipient device numbers, and forwarding the enhanced call content associated with the selected enhanced call content profile to one of the call recipient devices.

20 Claims, 23 Drawing Sheets

(56) References Cited

U.S. PATENT DOCUMENTS

| | | |
|---|---|---|
| 2005/0232247 A1 | 10/2005 | Whitley et al. |
| 2006/0148459 A1 | 7/2006 | Wolfman et al. |
| 2007/0047523 A1* | 3/2007 | Jiang ................... H04L 67/26 370/352 |
| 2007/0206613 A1 | 9/2007 | Silver et al. |
| 2008/0051071 A1 | 2/2008 | Vishwanathan et al. |
| 2008/0144637 A1 | 6/2008 | Sylvain et al. |
| 2009/0147778 A1 | 6/2009 | Wanless et al. |
| 2009/0156186 A1 | 6/2009 | Lyle |
| 2012/0093146 A1 | 4/2012 | Blomkvist |
| 2012/0303517 A1 | 11/2012 | Kang |
| 2013/0195257 A1 | 8/2013 | Wood et al. |
| 2013/0331073 A1 | 12/2013 | Balan et al. |
| 2014/0023183 A1 | 1/2014 | Brown et al. |
| 2015/0030145 A1 | 1/2015 | Balan et al. |
| 2015/0124957 A1* | 5/2015 | Roncoroni ........ H04M 3/42059 379/266.01 |
| 2015/0188907 A1 | 7/2015 | Khalid et al. |
| 2016/0019574 A1 | 1/2016 | Herkert et al. |
| 2016/0094708 A1* | 3/2016 | Brown ................. H04M 15/61 455/566 |
| 2017/0262891 A1 | 9/2017 | Green et al. |
| 2017/0264443 A1 | 9/2017 | Tu et al. |
| 2018/0102992 A1 | 4/2018 | Pysanets et al. |
| 2018/0176221 A1 | 6/2018 | Zhou et al. |
| 2018/0262614 A1* | 9/2018 | Drake ................... H04M 15/57 |
| 2019/0281151 A1 | 9/2019 | Lim et al. |
| 2019/0281158 A1 | 9/2019 | Gupta et al. |
| 2019/0394328 A1* | 12/2019 | Agarwal ........... H04M 3/42068 |

\* cited by examiner

CALL CONTENT MANAGEMENT FOR MOBILE DEVICES

CROSS-REFERENCE TO RELATED APPLICATIONS

This application is a continuation-in-part of prior filed U.S. patent application Ser. No. 16/298,640 filed on Mar. 11, 2019 entitled, "CALL CONTENT MANAGEMENT FOR MOBILE DEVICES," which claims the benefit of prior filed U.S. Provisional Patent Application No. 62/715,677 filed on Aug. 7, 2018 entitled, "ENGAGE," the entire contents of which are hereby incorporated by reference.

BACKGROUND

Conventionally, mobile device users receive calls from undesired sources every day and sometimes several times an hour depending on the particular day. The source numbers which are used to dial the users may be local numbers, long-distance numbers, anonymous numbers, spoofed numbers, etc. The calls may be spam calls, scam calls, robocalls, etc. With recent updates to smartphones and the call screen user interfaces used during a call, the sources of the calls are generally displayed in some capacity to permit the user to identify whether to answer the phone call or not, such as caller ID or other data services. However, in the event that the number is not known to the caller or is matched to his or her previously stored contacts, the caller may require additional content to be shared to demonstrate credibility as a reputable service or advertisement and not just some arbitrary caller without a reputation or legitimate product/service to share with the caller. There are generally limited tools available to demonstrate that the call is likely to be a scam or spam caller, especially in real-time so a caller can quickly decide whether to answer the call, drop the call, block the call, etc. With approximately 90 percent of business calls going unanswered, both ends users and callers require more advanced strategies for identifying callers and making informed decisions regarding whether to answer a call.

SUMMARY

Example embodiments of the present application provide at least a method that includes at least one of identifying a call from an enterprise device destined for a mobile device, responsive to identifying the call, accessing a call content application programming interface (API) operated by a content delivery device responsible for delivering call content to the mobile device, assigning an IP address and user identifier to a mobile device telephone number, forwarding call content data stored in an enterprise account profile of the enterprise device to the mobile device, responsive to forwarding the call content data, establishing a communication channel between the enterprise device and the mobile device, receiving a confirmation from the mobile device at the content delivery device confirming that the call content data was received and loaded on the mobile device and the communication channel was established, and responsive to receiving the confirmation, routing the call to the mobile device via the communication channel.

Another example embodiment may include a system that provides an enterprise device configured to setup calls to one or more mobile devices, and a content delivery device configured to deliver call content to the one or more mobile devices prior to calls being sent to the one or more mobile devices. The content delivery device is further configured to identify a call from the enterprise device destined for a mobile device among the one or more mobile devices, responsive to the call identification, access a call content application programming interface (API) operated by the content delivery device responsible for delivery of the call content to the mobile device, assign an IP address and user identifier to a mobile device telephone number, forward call content data stored in an enterprise account profile of the enterprise device to the mobile device, responsive to the call content data being forwarded, establish a communication channel between the enterprise device and the mobile device, receive a confirmation from the mobile device at the content delivery device which confirms that the call content data was received and loaded on the mobile device and the communication channel was established; and responsive to the confirmation being received, forward the call to a call center entity which routes the call to the mobile device via the communication channel.

Another example embodiment may include a non-transitory computer readable storage medium configured to store instructions that when executed cause a processor to perform identifying a call from an enterprise device destined for a mobile device, responsive to identifying the call, accessing a call content application programming interface (API) operated by a content delivery device responsible for delivering call content to the mobile device, assigning an IP address and user identifier to the mobile device telephone number, forwarding call content data stored in an enterprise account profile of the enterprise device to the mobile device, responsive to forwarding the call content data, establishing a communication channel between the enterprise device and the mobile device, receiving a confirmation from the mobile device at the content delivery device confirming that the call content data was received and loaded on the mobile device and the communication channel was established, and responsive to receiving the confirmation, routing the call to the mobile device via the communication channel.

Still another example embodiment may include a method that includes at least one of initiating a call via a calling device to a mobile device via a mobile device telephone number, responsive to initiating the call, retrieving call content data associated with a calling device profile, forwarding the call content data, via a content provider device, to the mobile device prior to establishing the call, hashing the mobile device telephone number to create a hashed value, storing the hashed value in the content provider device, authorizing the mobile device to receive the call content data, receiving a token representing the hashed value from the mobile device via the content delivery device, and connecting the call to the mobile device responsive to the token being authenticated.

Still yet another example embodiment may include a system that includes a calling device configured to call one or more mobile devices and a content provider device configured to forward the call content data to the one or more mobile devices, the calling device is configured to initiate a call to a mobile device among the one or more mobile devices via a mobile device telephone number, the content provider device, responsive to the call being identified, retrieves call content data associated with a calling device profile, forwards the call content data, via the content provider device, to the mobile device prior to the call being established, hashes the mobile device telephone number to create a hashed value, stores the hashed value in the content provider device, authorizes the mobile device to receive the call content data, and the calling device receives a token which represents the hashed value from the mobile device via the content delivery device, and connects the call to the mobile device responsive to the token being authenticated.

Still yet a further example embodiment may include a non-transitory computer readable storage medium configured to store instructions that when executed cause a processor to perform initiating a call via a calling device to a mobile device via a mobile device telephone number, responsive to initiating the call, retrieving call content data associated with a calling device profile, forwarding the call content data, via a content provider device, to the mobile device prior to establishing the call, hashing the mobile device telephone number to create a hashed value, storing the hashed value in the content provider device, authorizing the mobile device to receive the call content data, receiving a token representing the hashed value from the mobile device via the content delivery device, and connecting the call to the mobile device responsive to the token being authenticated.

Another example embodiment may include at least one of identifying a call to a mobile device, determining whether the call comprises call content data intended for the mobile device, initiating an active session and a time to live (TTL) associated with the call content data, forwarding the call content data to the mobile device when the call comprises call content data associated with the caller, and receiving a content confirmation from the mobile device that the call content data was received.

Still yet another example embodiment may include a system that includes a content delivery device and a mobile device, the content delivery device is configured to identify a call to a mobile device, determine whether the call comprises call content data intended for the mobile device, initiate an active session and a time to live (TTL) associated with the call content data, forward the call content data to the mobile device when the call comprises call content data associated with the caller, and receive a content confirmation from the mobile device that the call content data was received.

Still yet a further example embodiment may include a non-transitory computer readable storage medium configured to store instructions that when executed cause a processor to perform identifying a call to a mobile device, determining whether the call comprises call content data intended for the mobile device, initiating an active session and a time to live (TTL) associated with the call content data, forwarding the call content data to the mobile device when the call includes call content data associated with the caller, and receiving a content confirmation from the mobile device that the call content data was received.

Still another example embodiment may include a method that includes identifying a plurality of mobile device telephone numbers associated with a plurality of mobile devices, forwarding the plurality of mobile device telephone numbers to a content delivery device, hashing the plurality of mobile device telephone numbers, storing the hashed plurality of mobile device telephone numbers in the content delivery device, identifying a scheduled call campaign to the plurality of mobile devices, forwarding call content associated with schedule call campaign to the plurality of mobile devices prior to calling the plurality of mobile devices, and responsive to receiving confirmation that the content was successfully forwarded to the plurality of mobile devices, initiating a calling device to begin calling the plurality of mobile devices.

Another example embodiment may include a system that includes a content delivery device configured to forward content prior to conducting a call campaign, and a plurality of mobile devices, the content delivery device is configured to identify a plurality of mobile device telephone numbers associated with the plurality of mobile devices, hash the plurality of mobile device telephone numbers, store the hashed plurality of mobile device telephone numbers, identify a scheduled call campaign associated with the plurality of mobile devices, forward call content associated with schedule call campaign to the plurality of mobile devices prior to the plurality of mobile devices being called, and responsive to confirmation being received that the content was successfully forwarded to the plurality of mobile devices, initiate a calling device to call the plurality of mobile devices.

Still yet another example embodiment may include a non-transitory computer readable storage medium configured to store instructions that when executed cause a processor to perform identifying a plurality of mobile device telephone numbers associated with a plurality of mobile devices, forwarding the plurality of mobile device telephone numbers to a content delivery device, hashing the plurality of mobile device telephone numbers, storing the hashed plurality of mobile device telephone numbers in the content delivery device, identifying a scheduled call campaign to the plurality of mobile devices, forwarding call content associated with schedule call campaign to the plurality of mobile devices prior to calling the plurality of mobile devices, and responsive to receiving confirmation that the content was successfully forwarded to the plurality of mobile devices, initiating a calling device to begin calling the plurality of mobile devices.

Another example embodiment includes a method configured to perform one or more of receiving an initiated call from a calling entity at a server, the initiated call intended for a called entity, responsive to receiving the initiated call, initiating an application programming interface via the server to transmit first call content data to the calling entity and second call content data to the called entity, and responsive to receiving one or more confirmations that the first call content data and the second call content data were received, initiating a call service to establish a call session with the calling entity and the called entity.

Another example embodiment includes am apparatus configured with a receiver configured to receive an initiated call from a calling entity at a server, the initiated call intended for a called entity, and responsive to the initiated call being received, a processor is configured to initiate an application programming interface to transmit first call content data to the calling entity and second call content data to the called entity, and responsive to one or more confirmations having been received that the first call content data and the second call content data were received, the processor is further configured to initiate a call service to establish a call session with the calling entity and the called entity.

Another example embodiment includes a non-transitory computer readable storage medium configured to store instructions that when executed cause a processor to perform receiving an initiated call from a calling entity at a server, the initiated call intended for a called entity, responsive to receiving the initiated call, initiating an application programming interface via the server to transmit first call content data to the calling entity and second call content data to the called entity, and responsive to receiving one or more confirmations that the first call content data and the second call content data were received, initiating a call service to establish a call session with the calling entity and the called entity.

Another example embodiment may include a method that includes one or more of receiving call content at a mobile device, responsive to receiving the call content, adding a contact identifier to a contact list of the mobile device, receiving a call from a calling device at the mobile device, pairing the calling device with the contact identifier, and displaying the call content and the contact identifier during the call.

Still another example embodiment may include a mobile device that includes a receiver configured to receive call content at the mobile device, and a processor configured to responsive to the call content being received, add a contact identifier to a contact list of the mobile device, receive a call from a calling device at the mobile device, pair the calling device with the contact identifier, and display the call content and the contact identifier during the call.

Still yet another example embodiment may include a non-transitory computer readable storage medium configured to store instructions that when executed cause a processor to perform receiving call content at a mobile device, responsive to receiving the call content, adding a contact identifier to a contact list of the mobile device, receiving a call from a calling device at the mobile device, pairing the calling device with the contact identifier, and displaying the call content and the contact identifier during the call.

Still yet another example embodiment may include a method that includes one or more identifying a calling device number of a calling device, matching the calling device number with one or more of a plurality of enhanced call content profiles, selecting, based on a call identifier, one of the enhanced call content profiles comprising enhanced call content intended for one or more call recipient device numbers, and forwarding the enhanced call content associated with the selected enhanced call content profile to one of the call recipient devices.

Still yet a further example embodiment may include an apparatus that includes a processor configured to perform one or more of identify a calling device number of a calling device, match the calling device number with one or more of a plurality of enhanced call content profiles, select, based on a call identifier, one of the enhanced call content profiles comprising enhanced call content intended for one or more call recipient device numbers; and forward the enhanced call content associated with the selected enhanced call content profile to one of the call recipient devices.

Another example embodiment may include a non-transitory computer readable storage medium configured to store instructions that when executed cause a processor to perform one or more of identifying a calling device number of a calling device, matching the calling device number with one or more of a plurality of enhanced call content profiles, selecting, based on a call identifier, one of the enhanced call content profiles comprising enhanced call content intended for one or more call recipient device numbers, and forwarding the enhanced call content associated with the selected enhanced call content profile to one of the call recipient devices.

DETAILED DESCRIPTION

It will be readily understood that the components of the present application, as generally described and illustrated in the figures herein, may be arranged and designed in a wide variety of different configurations. Thus, the following detailed description of the embodiments of a method, apparatus, and system, as represented in the attached figures, is not intended to limit the scope of the application as claimed, but is merely representative of selected embodiments of the application.

The features, structures, or characteristics of the application described throughout this specification may be combined in any suitable manner in one or more embodiments. For example, the usage of the phrases "example embodiments", "some embodiments", or other similar language, throughout this specification refers to the fact that a particular feature, structure, or characteristic described in connection with the embodiment may be included in at least one embodiment of the present application. Thus, appearances of the phrases "example embodiments", "in some embodiments", "in other embodiments", or other similar language, throughout this specification do not necessarily all refer to the same group of embodiments, and the described features, structures, or characteristics may be combined in any suitable manner in one or more embodiments.

In addition, while the term "message" has been used in the description of embodiments of the present application, the application may be applied to many types of network data, such as, packet, frame, datagram, etc. For purposes of this application, the term "message" also includes packet, frame, datagram, and any equivalents thereof. Furthermore, while certain types of messages and signaling are depicted in exemplary embodiments of the application, the application is not limited to a certain type of message, and the application is not limited to a certain type of signaling.

Example embodiments provide call content management of content in associations with calls to and from mobile device users. Enterprise entities (e.g., government, corporate, etc.) may desire to have their services readily identified to mobile device users when providing appointments, services, advertising, etc. Mobile device users require secure communication channels to reduce fraud associated with scam callers and other falsified entities seeking to monetize from users using unexpected and undesirable approaches, such as solicitation calls and mobile device messages (SMS).

Figure 1A:
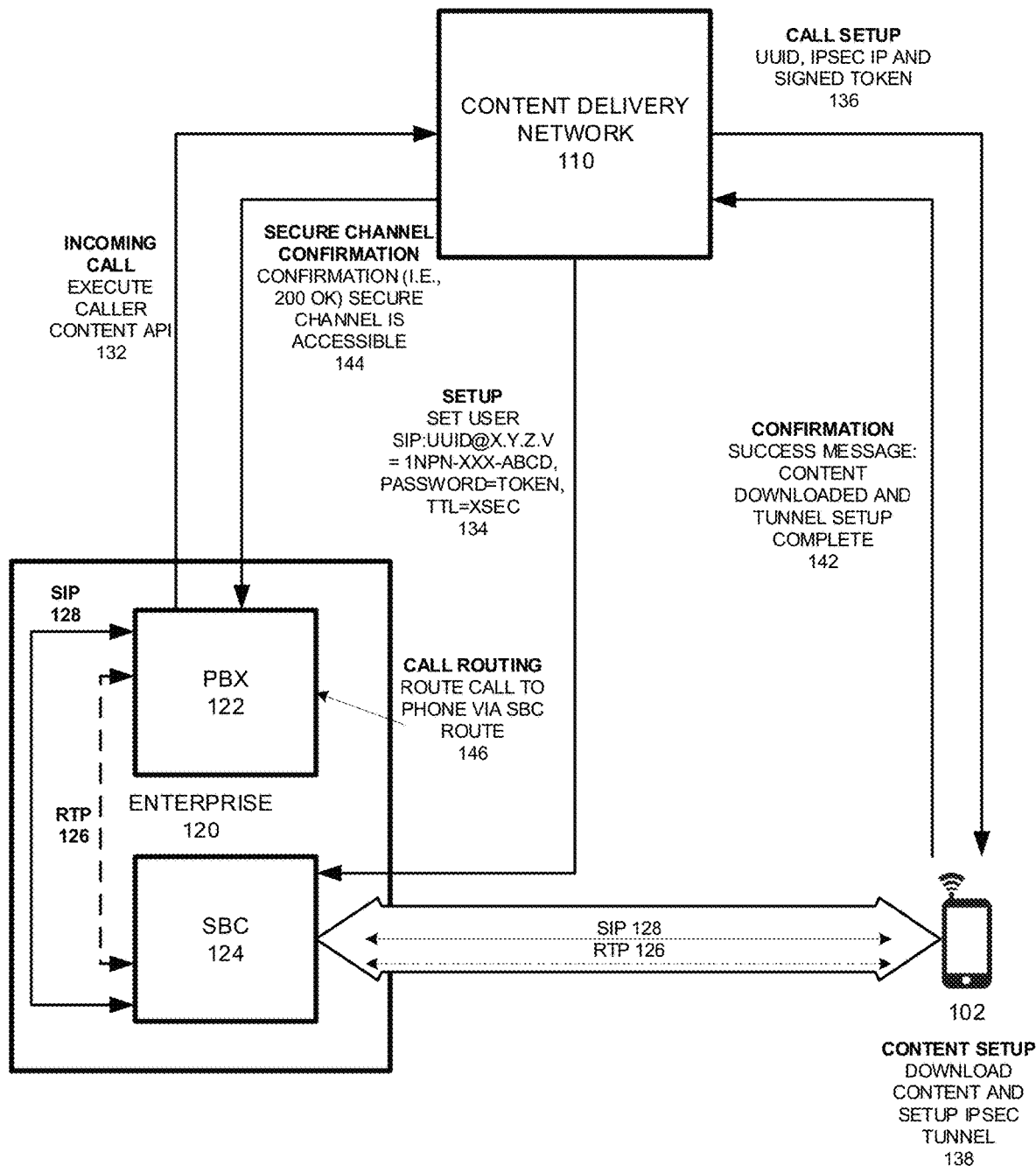
FIG. 1A illustrates an example call content management network configuration according to example embodiments.

FIG. 1A illustrates an example call content management network configuration according to example embodiments. Referring to FIG. 1A, the network configuration 100 includes an end user device 102 as a mobile device which is configured to receive a call routed from a carrier network. The enterprise network, such as a provider of services, may attempt to communicate with a particular end device, such as mobile device 102 as part of a calling campaign to advertise services, perform customer services, etc. In such an example, many end users or 'B' devices may be dialed via automated and digitized call services. Those 'B' devices may be registered to receive pushed content that corresponds with the caller, which in this case is the enterprise 120.

During an initial call setup procedure, a SIP channel 128 and a RTP channel 126 may be setup to create an end-to-end IP security (IPsec) channel between the enterprise 120 calling device, which is based on a private branch exchange (PBX) 122 and/or a session border controller (SBC) 124. Once an incoming call is identified 132, the content API operating on the mobile device 102 is initialized via the content delivery network (CDN) 110. The user device is setup 134 with a particular SIP identifier including a user identifier UUID and IP address, which is linked to their mobile device telephone number and corresponding token which is stored on the mobile device and matched via the hash stored in the CDN 110. A call setup message may then be submitted to the mobile device 102 which provides a the UUID, the IPSEC IP channel information, and an authorized signed token 136 to the mobile device 102. The mobile terminal may then proceed to communicate with the content delivery network 110 to download content associated with the caller and setup the IPsec tunnel 138. The mobile terminal may then indicate that the content was downloaded in a confirmation message 142, which identifies certain content and a particular enterprise identifier associated with the caller. The CDN 110 may confirm the secure channel is setup via a SIP communication parameter, such as 200 OK and that the channel is accessible 144. The call is then routed 146 to the mobile device 102 via a SBC route via the enterprise 120. The call will appear to arrive contemporaneously with the content, so the content can be displayed without delay. The content arrives prior to the call (i.e., operation 138), however, the user will not recognize any lag in the content being loaded and the call being received. The content may include a banner logo image, links to websites, multimedia files, audio, video, animations, scrolling images, etc. A user can identify the content on the display of their mobile device 102 and confirm the content is desirable prior to answering the phone. The content may also have its own information response options (i.e., menus, message response options, link URLs) which provide alternatives for answering the call via the mobile device.

Prior to calls being sent to one or more 'B' number users (i.e., called devices/home devices/mobile devices), the content associated with the caller 'A' number dialer entity (i.e., enterprise 120, may be pre-loaded on the mobile devices via a subscription service that aims to load content of subscribed enterprise entities to subscribed end user devices. For example, a large entity enterprise group 120 may desire to launch a peek hour campaign to solicit certain 'B' users for a new credit card. The campaign may include content that demonstrates the logos, the links, multimedia, a short funny commercial, etc. The content is data intensive and cannot be uploaded on the fly during the few seconds preceding a caller pickup from a call dialing event. Therefore, the content must be identified, linked to a caller by an identifier, forwarded to a mobile device (or many devices) which subscribes to the content services prior to an expected call time, and confirmed and linked to the caller identifier so when a call does arrive, the content can be quickly referenced and displayed.

In operation, content providers can configured the content and/or related applications directly via the content management application through an API and/or portal. The content provider users an outbound API to prepare mobile devices for calls. The CDN 110 sends a push notification to a software development kit (SDK) with a link to content and the SDK downloads the content and sends back an indication the phone is ready. The content provider/call center/ enterprise 120 may then initiate a call after content has been distributed to intended recipients. The SDK may send call information to the network.

Figure 1B:
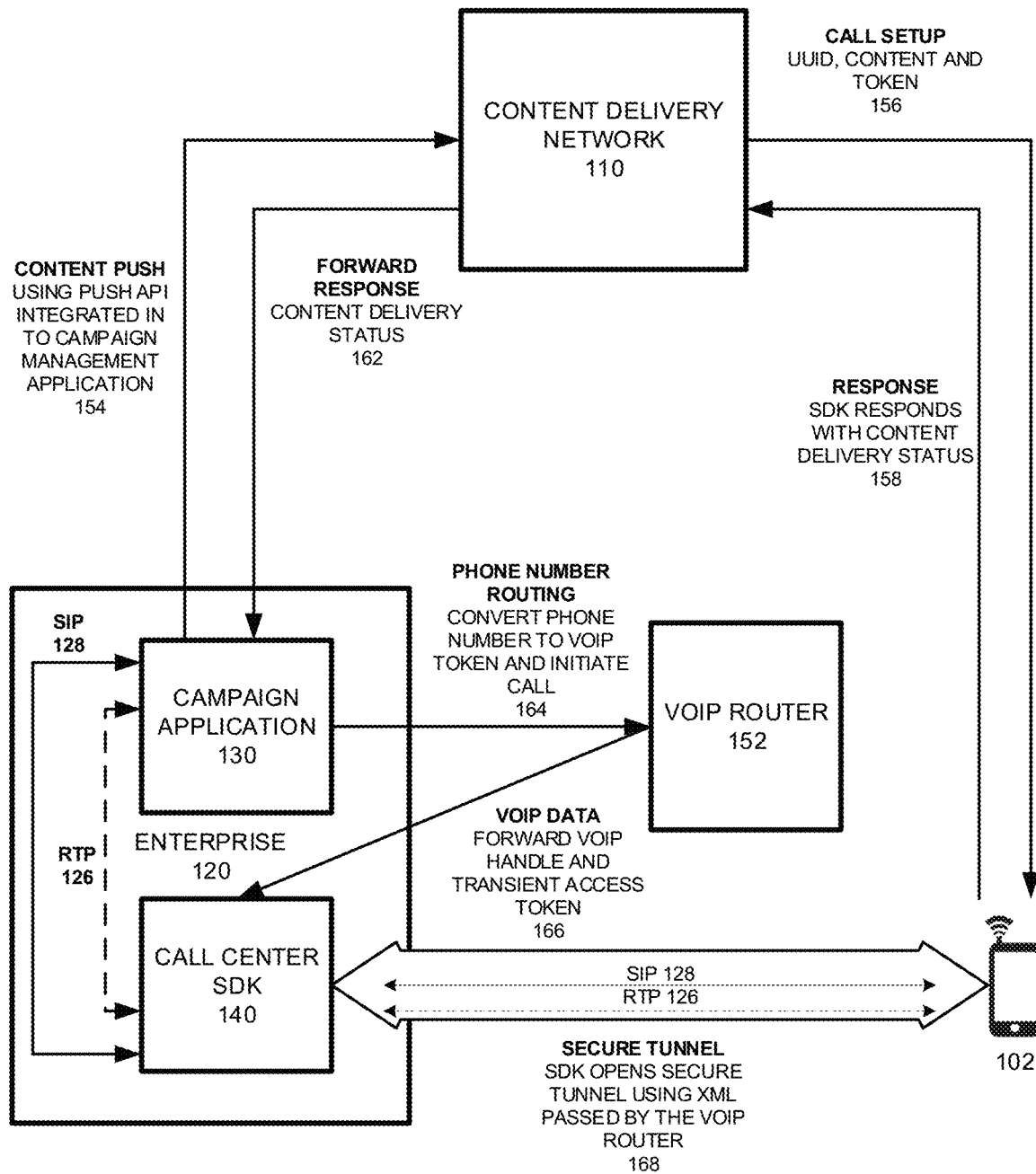
FIG. 1B illustrates another example call content management network configuration according to example embodiments.

FIG. 1B illustrates another example call content management network configuration according to example embodiments. Referring to FIG. 1B, the example 150 provides additional details regarding the calling of mobile devices during a call service. In operation, the enterprise entity 120 may push data 154 to a 'B' number entity, such as callee 102 through the push API using integration with campaign management software 122. The CDN configures the content and its accompanying rules and delivers the device ready bundle (DRB) to the device 102 in a call setup 156. The device 102 may respond back with a status along with certain telemetry information 158. The CDN 110 delivers telemetry information to the enterprise 120 as an API response 162 (i.e., content delivery status). The enterprise software campaign application 130 submits the 'B' number 164 through the VOIP API to the VOIP router 152 with a token. The router 152 converts the phone number to a VOIP handle and creates the VOIP XML as a handle and transient access token 166. The enterprise campaign application will then hand the XML off to the call center SDK 140 installed in the call application software. The call center SDK opens a secure tunnel 168 using the XML passed by the VOIP router 152. The calls can then be made to the end user devices/'B' devices and the content can be retrieved and displayed directly form the user device during the call.

Figure 2:
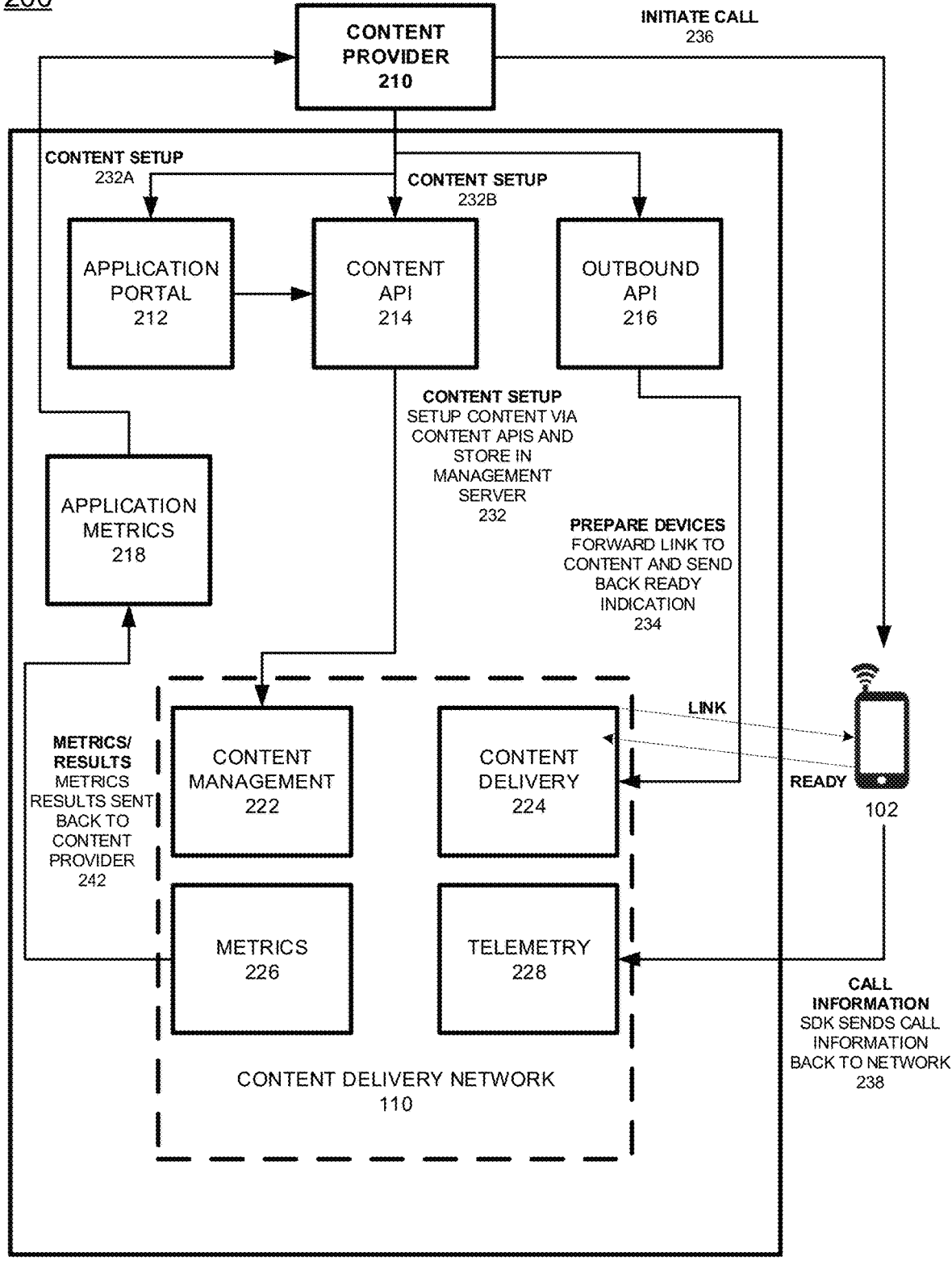
FIG. 2 illustrates an example logic diagram of a content delivery provider network according to example embodiments.

FIG. 2 illustrates an example logic diagram of a content delivery provider network according to example embodiments. Referring to FIG. 2, the configuration 200 includes a detailed view of the content delivery network CDN 110 and the corresponding action modules which operate with the content provider 210 to manage call content and calling processes. The process may provide a content setup operation 232 which sets up content via content APIs and stores the content 232 in a management server. The application portal 212 and content API 214 are part of the content setup operations 232A/232B. The outbound API 216 provides a link to the CDN 110 to provide content management 222, and content delivery 224 to the devices prior to calls being sent. The devices are prepared for upcoming calls by forwarding a link to the content stored in the CDN 110 which when accessed causes a ready indication to be sent back 234 indicating a call may proceed. Then, a call may be sent 236 to the end user 102. The call may be tracked for call metrics and other telemetry data and the SDK may send the call information back to the network 238. Telemetry data 228 may be compiled to identify whether content is displayed on a user device, an indicator can be used to confirm such information is displayed during a call, the tally of those confirmations may be maintained at the CDN 110 for all placed calls over a period of time. As the metrics 226 are compiled (i.e., number of calls made, number of calls answered, number of calls connected over X seconds, number of calls paired with content information, number of links accessed in the content, etc.), throughout the call campaign to various end user devices, the results/metrics are sent back to the content provider 242 to provide feedback and strategies for subsequent campaigns. The application metrics 218 are stored in the content provider 210.

Further to the call example, the when the call is initiated, as the authorization of the caller is performed, the 'B' number dialed is sent to the CDN and stored as a hashed value so other parties cannot see the telephone numbers. A token composed of a confirmation that the hashed value matches the B number may be used to confirm the user device is valid and can accept the call. The token may be based on the hashed phone number and other non-sensitive information and would be returned from the mobile device to the content provider/call center. All the 'B' numbers uploaded form the content provider to the CDN 110 may be hashed prior to being stored, so no actual numbers are stored in the content provider. The content provider 210 may upload a raw text number for the 'A' number, however, all numbers are stored in a hashed format at the CDN 110. A tracking ID can be assigned to a particular call so the call metrics can be identified on a per call basis. The metrics also do not include raw telephone numbers which would be vulnerable to theft. During call authorization, the hash is compared to a particular 'B' number and a token stored on the mobile device can be generated and sent to confirm the comparing operation is accurate. The CDN 110 may store the hash for the 'B' number and the token received from the mobile device. In addition to the token identifying the hashed 'B' number, the token may also include non-sensitive information, such as content identifiers needed to identify the content for the call, hardware IDs of the device being called, etc.

Figure 3:
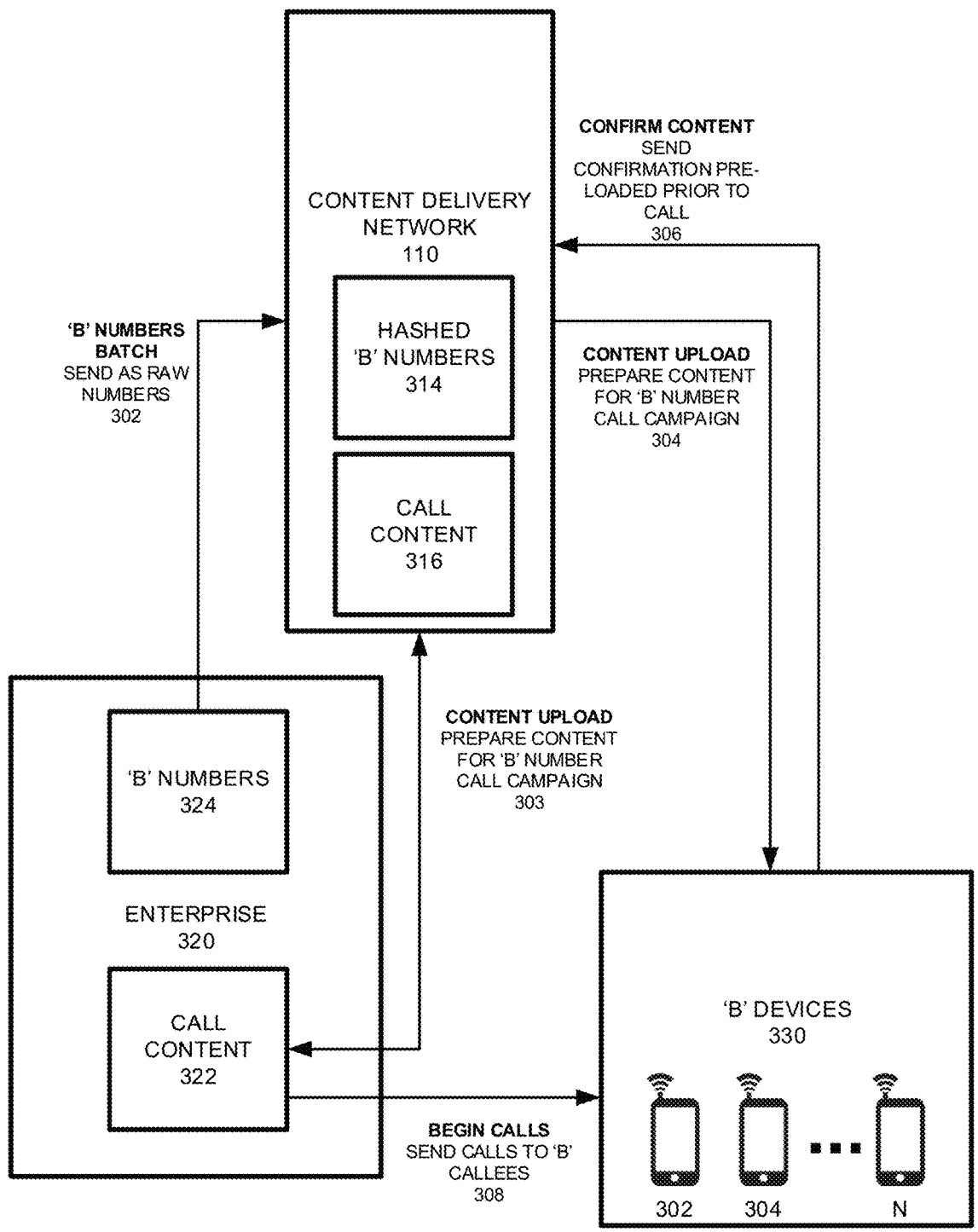
FIG. 3 illustrates a batch call and content management configuration according to example embodiments.

FIG. 3 illustrates a batch call and content management configuration according to example embodiments. Referring to FIG. 3, the network configuration 300 includes a calling entity, such as an enterprise device 320 with call content 322 and 'B' numbers of mobile devices to call during a call campaign. The call content and 'B' numbers may be forwarded to the content delivery network 110 so the 'B' numbers can be hashed 314 and the call content 316 can be stored for uploading to the 'B' device 330 prior to the calls being dispatched to those devices (i.e., 302, 304 . . . N). This approach ensures the devices 330 can quickly display the call content during the call for an optimal calling experience.

In operation, a set of 'B' numbers may be identified from the enterprise entity 320 and sent as a batch of raw numbers 302 (i.e., xxx-xxx-xxxx) to the content delivery network 110. The numbers are hashed for security purposes and stored 314. The call content can be linked to the calls by identifiers to images, video, text, etc. The content is uploaded 303 to the CDN 110 and is then uploaded 304 to the devices 330 prior to any calls being placed. The devices 330 may confirm the content is received 306 and those devices which send confirmations may be identified in a database of the CDN 110. Those confirming devices are ready for subsequent call processing. The call content confirmations 306 are sent responsive to the content being sent 304 to the devices. Once the content is sent and stored on the devices, the devices may begin to be called 308 via a call processing module of the enterprise 320, such as the VOIP router 152.

A call campaign may define the 'B' numbers to dial, the content to display during the call, a time-to-live (TTL) of the content being displayed, and a date and time to begin the call content upload and/or dialing the calls. Most call campaigns specify a specific time period when the calls should be placed to increase the likelihood that the calls are answered and do not offed the called device users. For example, calls are generally not placed at night or during lunch and dinner to avoid pestering the device users. The call campaign may be a data file that is sent to the content delivery network so the call content can be uploaded prior to the calls being placed. For example, the CDN 110 may upload content 4, 6, 8, 12, 24 hours before a call campaign. The call content may be displayed during the first 30 seconds of a call and may be deleted on the devices thereafter to free up memory/disk space.

Figure 4:
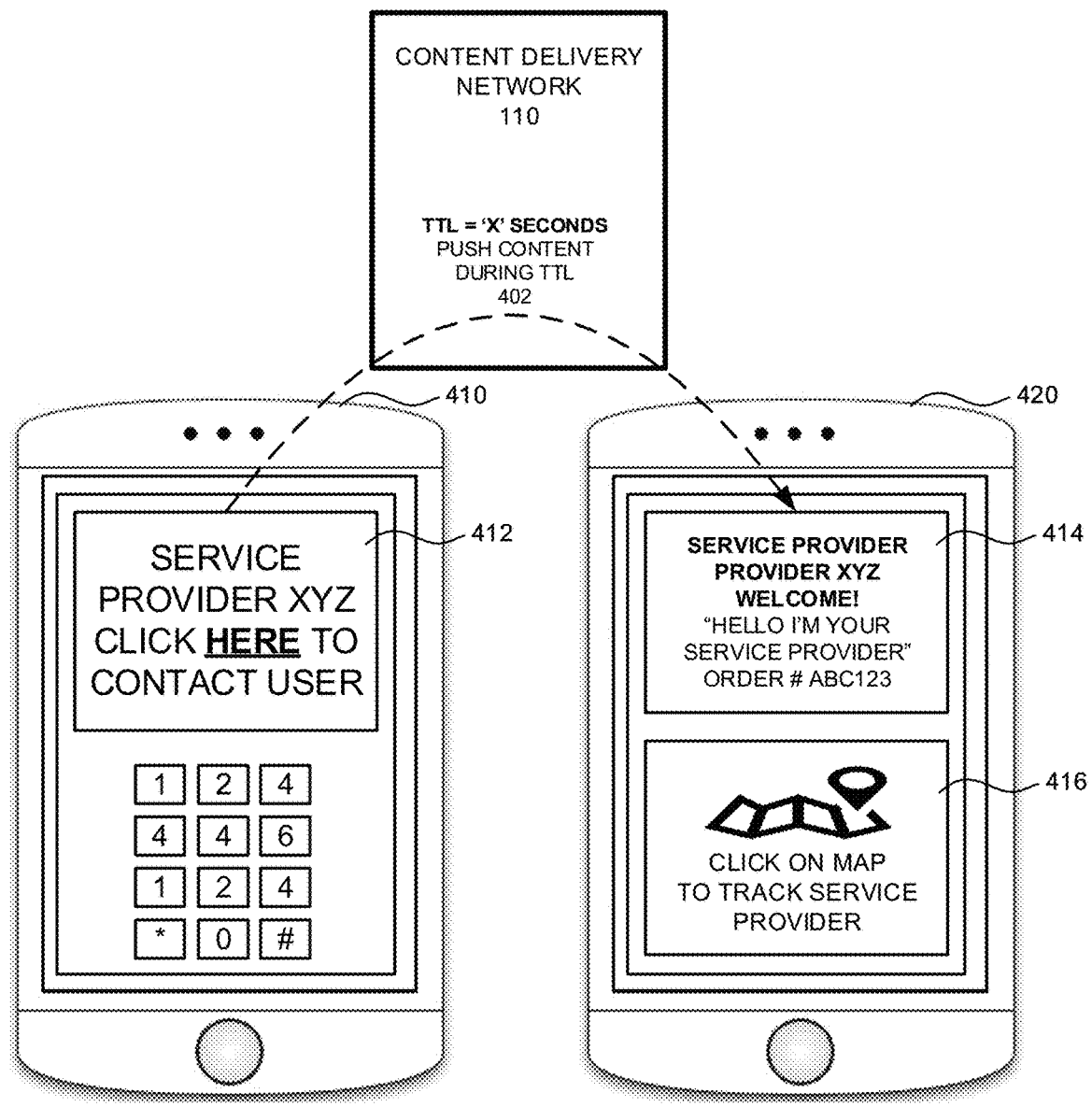
FIG. 4 illustrates a user interface of a service provider forwarding call content to a mobile device according to a content delivery network configuration according to example embodiments.

FIG. 4 illustrates a user interface of a service provider forwarding call content to a mobile device according to a content delivery network configuration according to example embodiments. Referring to FIG. 4, the configuration 400 includes a service provider, such as a utility company, subscription service, vehicle taxi service, food delivery service, etc. The service provider device 410 may be a service operator's mobile device which offers an option to contact the user of the service via a display option 412 on the mobile device 410. The content delivery network 110 may receive the contact selection option from the service provider device 410 and initiate a time-to-live (TTL) 402 for 'X' seconds. During this time, any call content associated with the service provider, such as a logo, status update (i.e., "heading your way", "food is being delivered", etc.), location information associated with a current location of the user device, etc., is forwarded to the user device 420. The user device display 414 may display information, such as a current map 416 of the service provider device location and other service provider call content. As the TTL expires, the content may be discarded and any further information sharing between the service provider device 410 and the user device 420 may be discontinued, however, an ongoing call may still be maintained along with additional SMS messages and calls which are sent/placed after the TTL has expired.

In order for the call content to be retrieved and displayed on the end user device, there are certain parameters which need to be identified, such as the content identifier (ID), which identifies the content to be delivered, a tracking identifier (ID), which identifies the customer's ID for reporting purposes, a phone number of the service provider, a company code (i.e., a registered API key), a calling window (TTL window).

Figure 5:
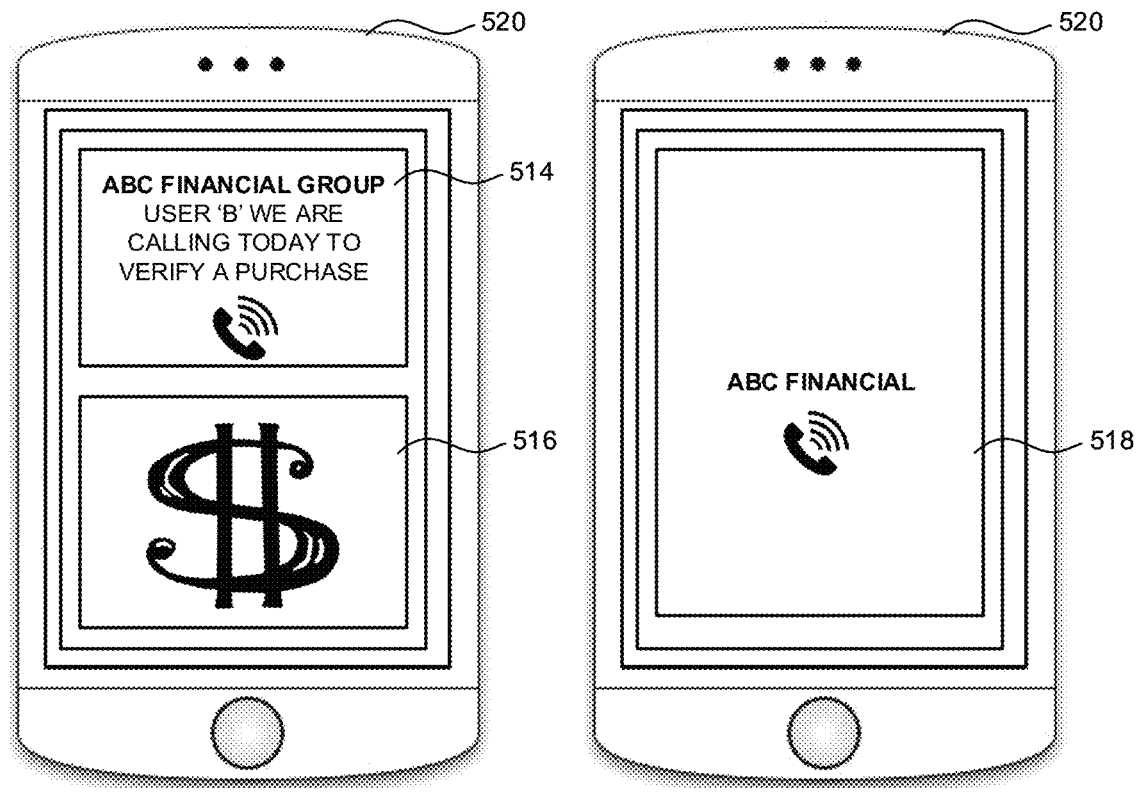
FIG. 5 illustrates example user interfaces of potential call content delivery options according to example embodiments.
Figure 5:
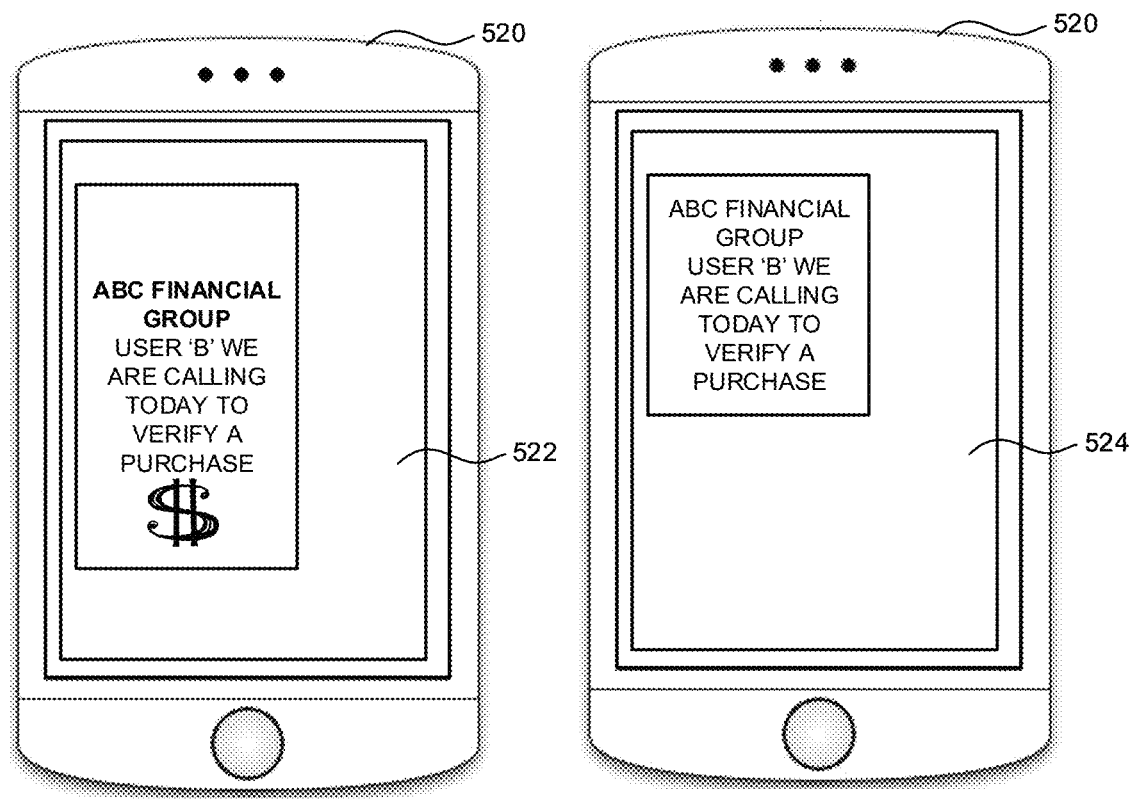

FIG. 5 illustrates example user interfaces of potential call content delivery options according to example embodiments. In this example, each 'B' user device is different and whether it be a campaign for advertising or a service provider attempting to communicate with an end user, the user device may have certain preferences and/or parameters engaged for receiving content. For example, in FIG. 5, the examples 500 include the user device 520 receiving a full call content menu with caller identification information 514 along with company logo and other identifiers and marketing information 516. This option represents the call content with the call itself. The next option is to have just the caller identified, such as caller ID 518. In this configuration, the end user device 520 may be configured to block call content or may not have received any call content prior to the call. Yet another option is to have a multimedia message service (MMS) that sends a text message and certain multimedia information in the text message interface 522. Still another option is to have the messaging sent as a SMS message 524 without any images or other call content type data.

Figure 6A:
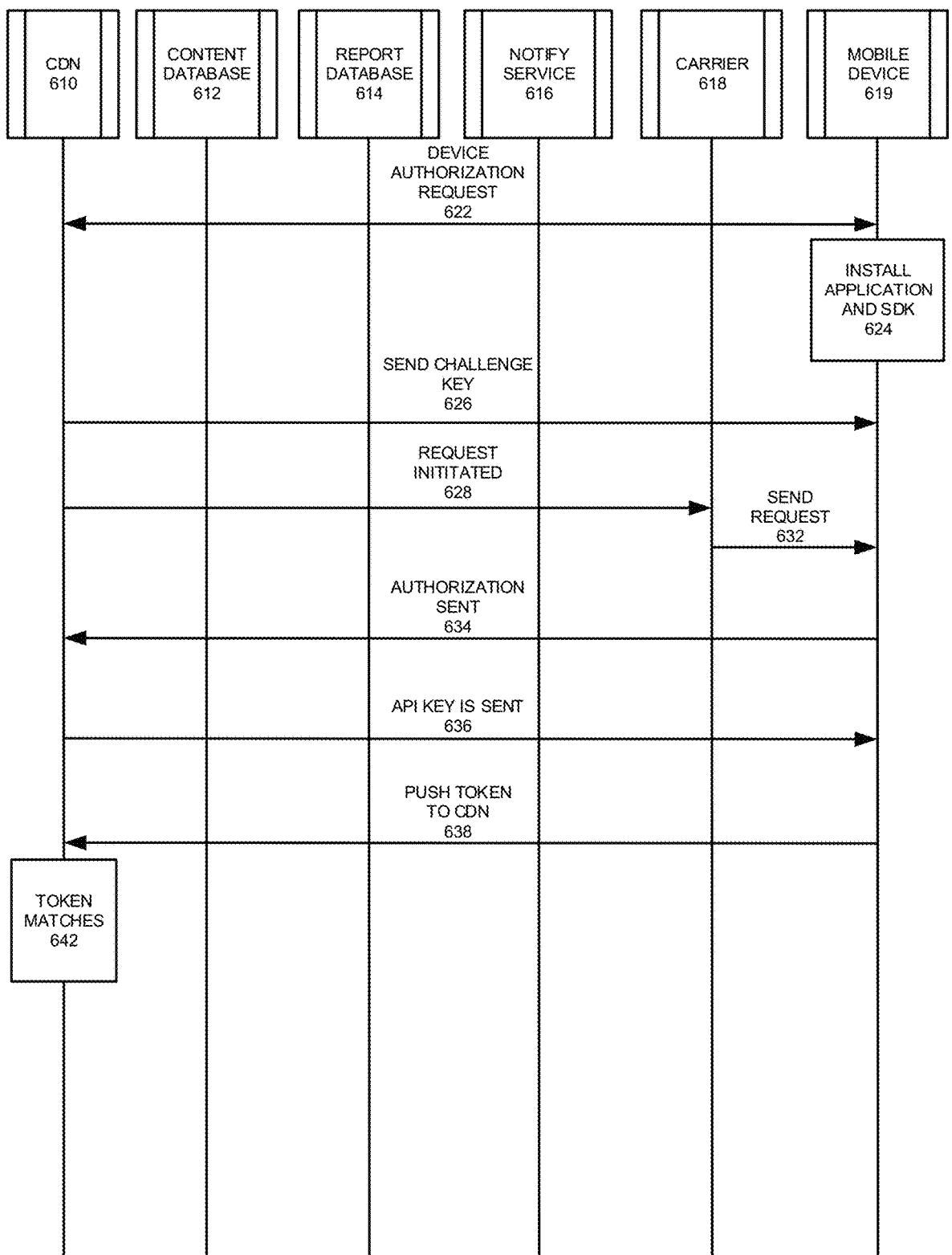
FIG. 6A illustrates an example of mobile device authentication by the content delivery network according to example embodiments.

FIG. 6A illustrates an example of mobile device authentication by the content delivery network according to example embodiments. Referring to FIG. 6, the system 600 includes various system network components 610-619 which contribute to a call authorization, content creation and calling process. This example 600 is an authorization procedure. During a call setup process or preliminary setup process, the end user mobile device 619 may be authorized by the content delivery network 610 by receiving a device authorization request 622 from the mobile device 619. The device 619 may install an application with a SDK 624. The authentication process then includes various operations, such as forwarding a challenge key 626 to the mobile device. The CDN 610 then sends a request 628 to a carrier 618, which forwards the request 632 to the mobile device 619. The authorization is then sent 634 and an API key is returned 636. A token is then forwarded to the CDN 638 for comparison purposes to the known hashed b-number of mobile device 619. The content database 612 stores call content data which can then be forwarded during the call. Call metrics are forwarded to the telemetry report database 614 for subsequent call management operations when the token matches 642. The notify service 616 provides notification forwarding services when notifications need to be sent to the mobile device 619.

Figure 6B:
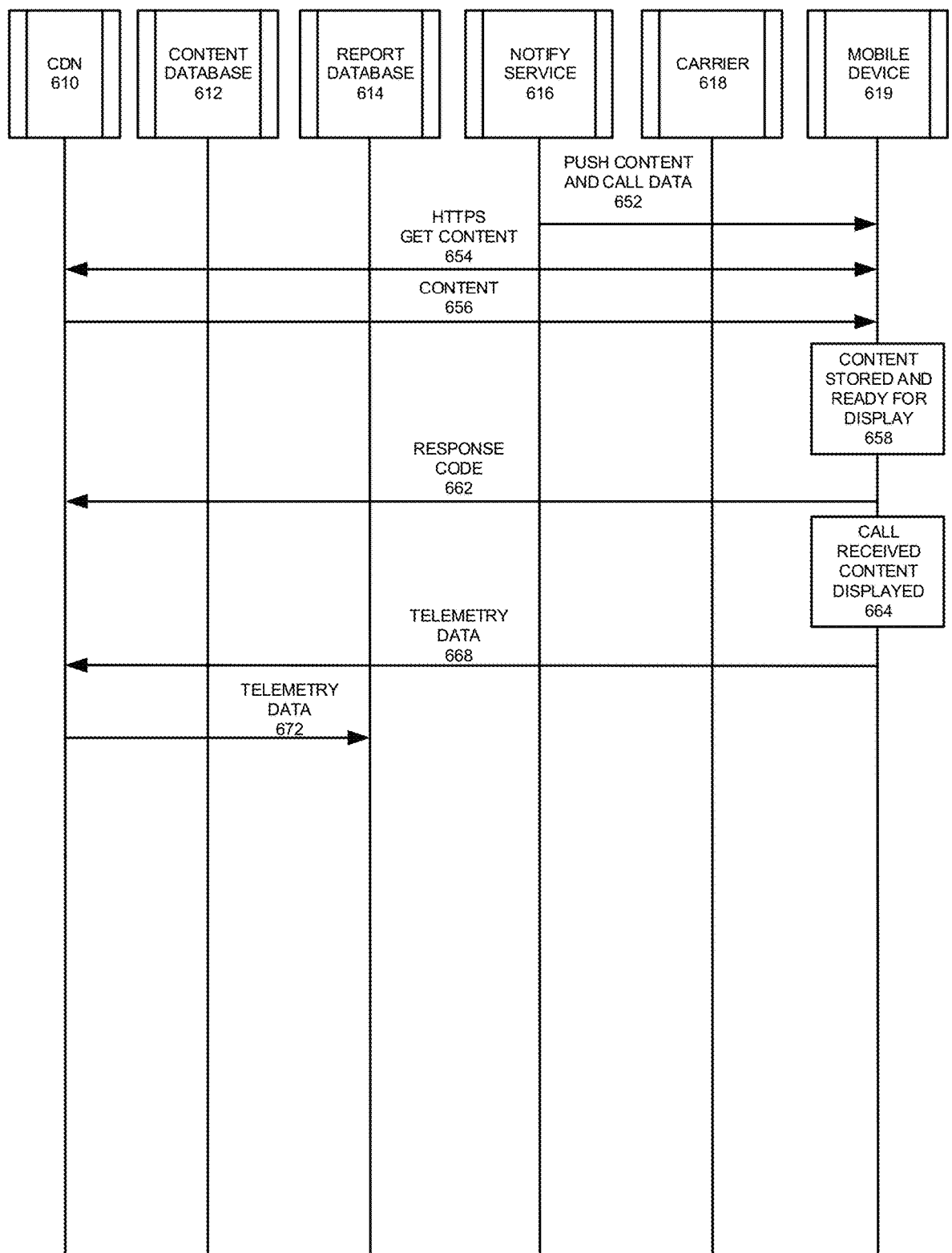
FIG. 6B illustrates an example of mobile device call content delivery performed by a content delivery network according to example embodiments.

FIG. 6B illustrates an example of mobile device call content delivery performed by a content delivery network according to example embodiments. Referring to FIG. 6B, the system configuration 650 includes a procedure for calling a mobile device 619. In this example, the notify service 616 sends call content related parameters 652 to the mobile device 619 prior to any call being made to the mobile device 619. The parameters may include a URL, tracking ID, TTL, expiration date, service provider ID, content provider ID and custom data identifier. A HTTPS get content message 654 is sent from the mobile device 619 to the CDN 610. The content 656 is then sent to the mobile device 619, where it is stored locally 658 and may be recalled for display corresponding to a call that is received. A response code is sent 662 to confirm the content was completely downloaded on the mobile device. Then, as a call is received which invokes the call content the content is displayed 664. The results of the call are sent as telemetry metric data 668 to the CDN 610, which in turn forwards 672 the information to the report database 614.

Figure 7A:
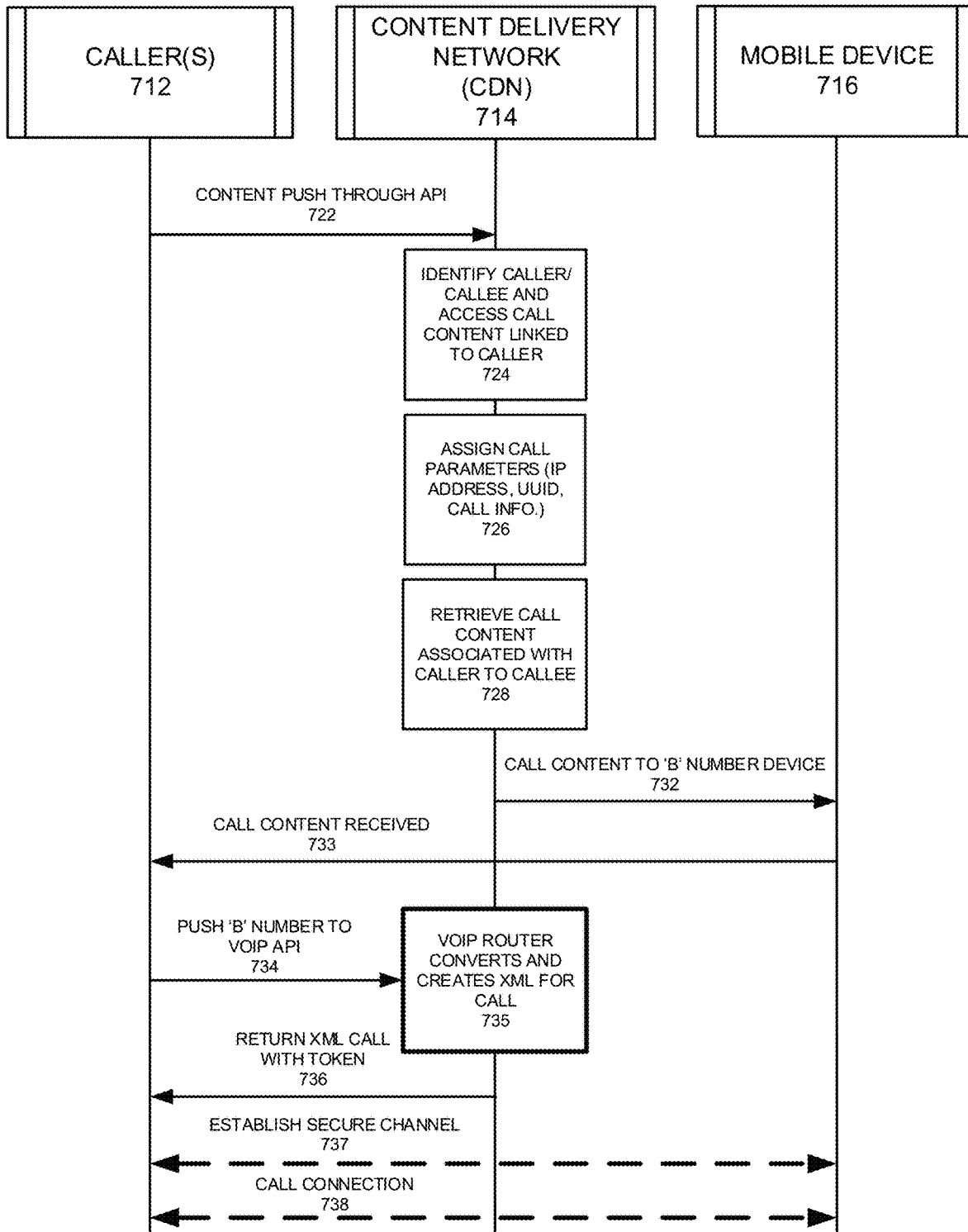
FIG. 7A illustrates a system network configuration that provides a call setup to a mobile device with call content delivery according to example embodiments.

FIG. 7A illustrates a system network configuration that provides a call setup to a mobile device with call content delivery according to example embodiments. Referring to FIG. 7A, the system 700 includes one or more callers 712, such as calling entities, enterprise members, etc. The callers may initiate calls through the CDN 714 to various called devices or 'B' devices which are known. One call may be placed 722 to the CDN 714, which then identifies the caller/callee(s) and accessed call content linked to the caller 724 in a caller profile stored in the CDN 714. The call content may be pre-registered as images, URLs, video, audio, etc. The called device may be assigned call parameters 726, such as in a SIP calling scenario (i.e., IP address, UUID, and other calling information). The call content is retrieved and associated with the callee 728 and then sent 732 to the mobile device 716. A confirmation 733 of the call content having been received and loaded may be sent to the caller entity 712 from the mobile device 716. A 'B' number may be pushed 734 to the VOIP API of a VOIP router device which converts the 'B' number to create XML data used to route a call 735. A XML-based call command and token may be returned 736 to the caller entity. A secure channel is established 737 between the calling entity and the called entity and a call content confirmation is sent indicating the call content was received. The call can then be setup to dial or message the user (i.e., SMS). The call content will be loaded once the call is sent. The call content may be loaded prior to the call being answered. The call connection is established 738 to route the call accordingly.

The process may include identifying a call from an enterprise device destined for a mobile device, responsive to identifying the call, accessing a call content application programming interface (API) operated by a content delivery device responsible for delivering call content to the mobile device, assigning an IP address and user identifier to the mobile device telephone number, forwarding call content data stored in an enterprise account profile of the enterprise device to the mobile device, responsive to forwarding the call content data, establishing a communication channel between the enterprise device and the mobile device, receiving a confirmation from the mobile device at the content delivery device confirming that the call content data was received and loaded on the mobile device and the communication channel was established, and responsive to receiving the confirmation, routing the call to the mobile device via the communication channel.

The method may also include transmitting a secure channel confirmation from the content delivery device to the enterprise device confirming the communication channel was established. In one example, the secure channel confirmation is a 200 OK session initiation protocol (SIP) message. The call content data includes one or more of an image file, an audio file, a video file, a location map, and a web link. The communication channel is a IPsec channel and is established between the mobile device and a session border control (SBC) entity and a public branch exchange (PBX) operated within an enterprise network hosting the enterprise device. Responsive to the call being sent, an enterprise account profile linked to the content may be accessed and provided to the mobile device to retrieve the call content data. The call may be a session initiation protocol (SIP) call type. The IP address and user identifier are linked to the mobile device telephone number via the session border control (SBC) entity. Prior to establishing the communication channel, an authorization of the mobile device may be performed, wherein the authorization includes one or more of a biometric data input, a passphrase input, and a mobile device location determination.

Figure 7B:
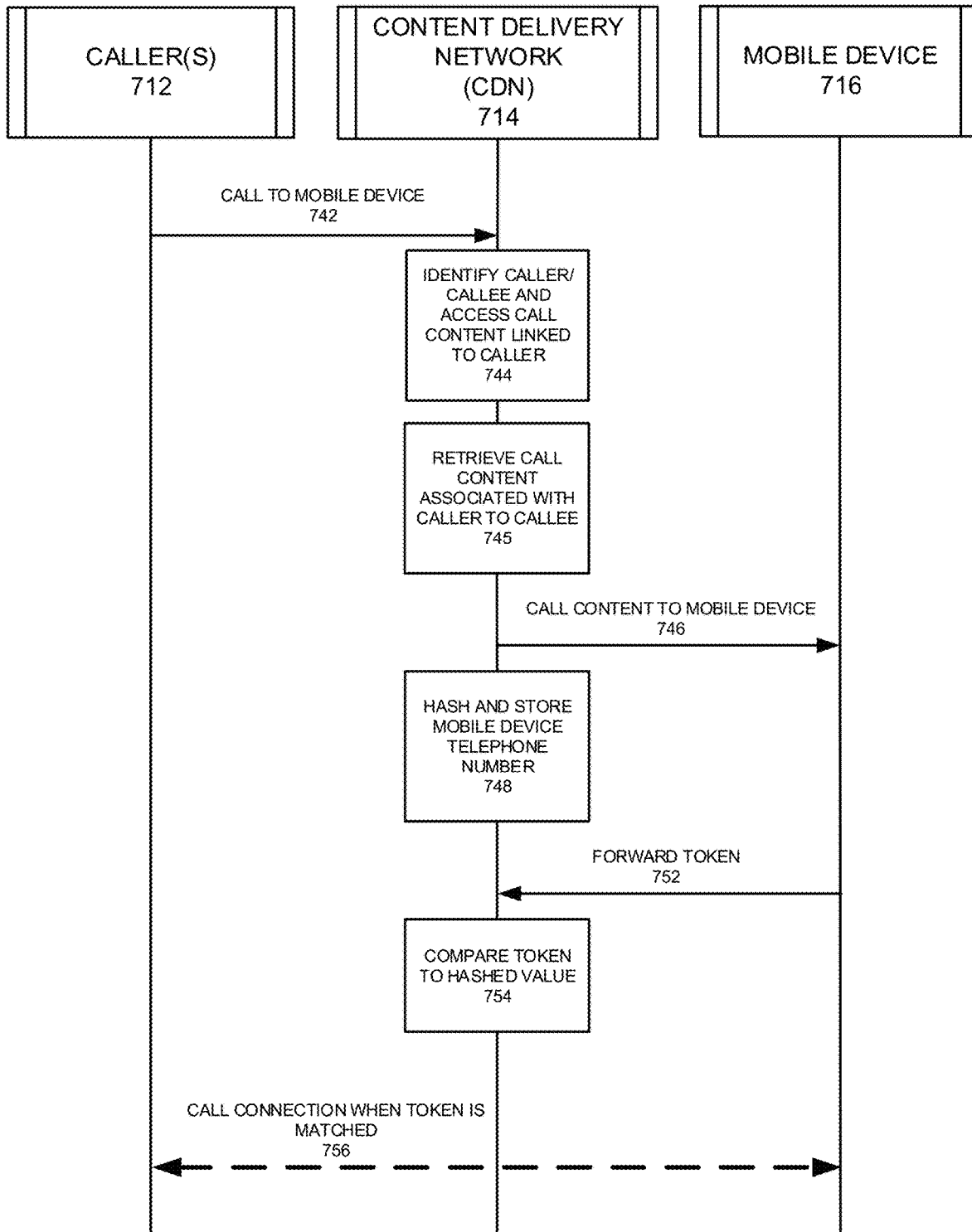
FIG. 7B illustrates a system network configuration that provides a call authentication to a mobile device with call content delivery according to example embodiments.

FIG. 7B illustrates a system network configuration that provides a call authentication to a mobile device with call content delivery according to example embodiments. Referring to FIG. 7B, the system 740 includes a call 742 to a mobile device, accessing call content 744 to forward to the mobile device, retrieving the content 745, providing the call content 746 to the mobile device, hashing and storing the mobile device telephone number information 748, receiving a token from the mobile device 752 which identifies the mobile device, comparing the token 754 to the hashed value stored in the CDN 714, and when the token matches the hash information, establishing a call connection 756.

Another example method may include initiating a call via a calling device to a mobile device via a mobile device telephone number, responsive to identifying the call, retrieving call content data associated with a calling device profile, forwarding the call content data, via a content provider device, to the mobile device prior to establishing the call, hashing the mobile device telephone number to create a hashed value, storing the hashed value in the content delivery device, authorizing the mobile device to receive the call content data, receiving a token representing the hashed value from the mobile device via the content delivery device, and connecting the call to the mobile device responsive to the token being authenticated.

The method may also include comparing the token to the hash value stored in the content delivery device. The token includes the hashed telephone number and one or more hardware identifiers of the mobile device. The method may also include transmitting a notification to an application interface, the notification comprising a link to the call content, and responsive to receiving a confirmation of the notification being received, uploading the content from the content provider device to the mobile device. The method may also include responsive to connecting the call to the mobile device, loading the loading the call content on a display of the mobile device, and prior to completing the call, performing an authorization of the mobile device, wherein the authorization comprises one or more of a biometric data input, a passphrase input, and a mobile device location determination.

Figure 7C:
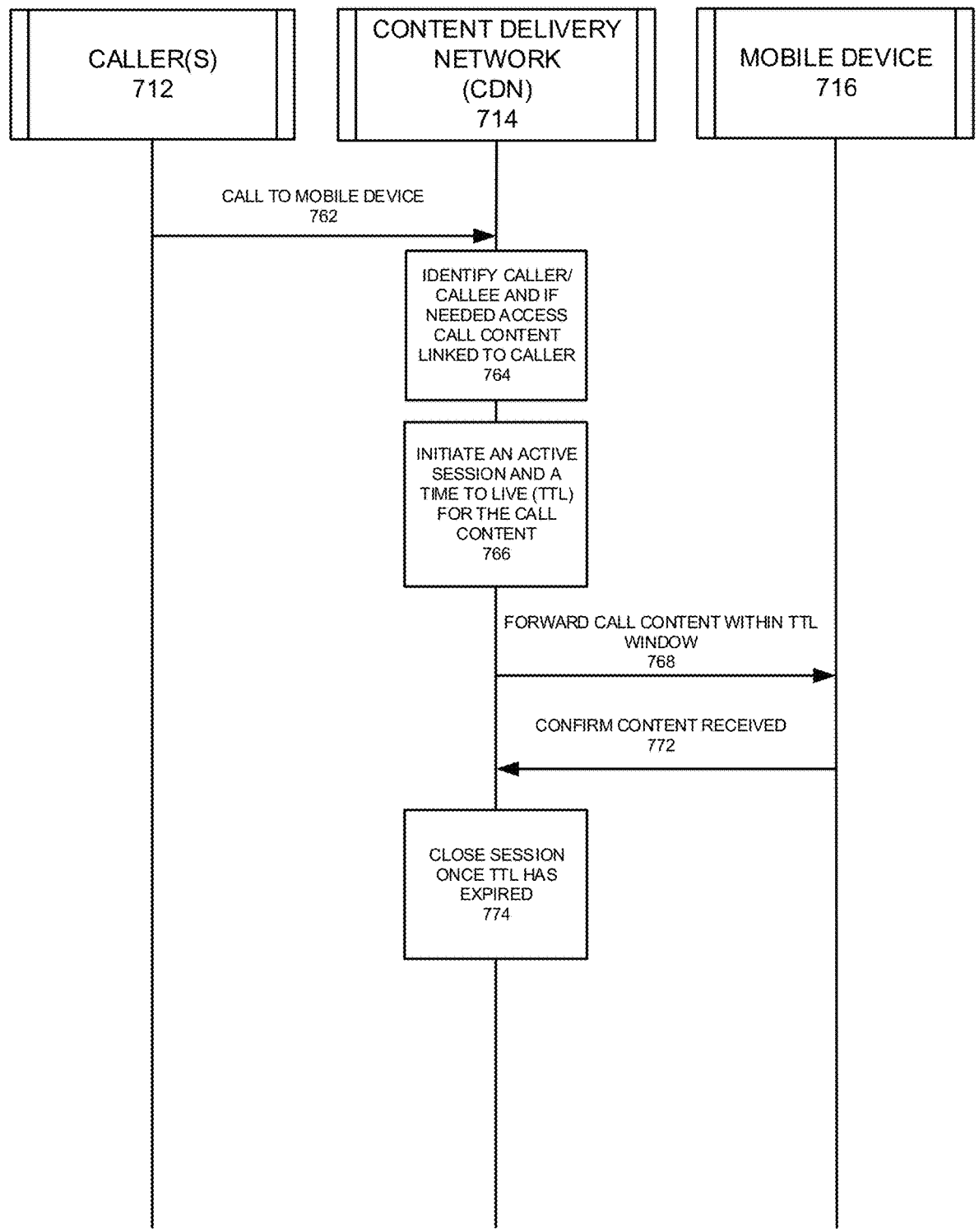
FIG. 7C illustrates a system network configuration that provides a call setup to a mobile device with call content delivery via a service provider according to example embodiments.

FIG. 7C illustrates a system network configuration that provides a call setup to a mobile device with call content delivery via a service provider according to example embodiments. Referring to FIG. 7C, the method 760 may include placing a call 762 to a mobile device. In this example, the call may be sent by another mobile device user as a service provider entity that is assisting the user of the mobile device 716. The caller may be identified and any call content is also identified 764, and an active session may be initiated 766 which establishes a TTL duration when the caller can call the mobile device 716, share call content, etc., and the expiration of the TTL. Once the TTL is set, the call content can be forwarded to the mobile device 768 and a confirmation is sent 772 to confirm it was received. In this caller to callee scenario, the content does not have to be sent prior to the call being answered, however, the window of time for performing the content transfer may be set by the TTL. The expiration of the TTL causes the content sharing session to close 774.

One example method of operation may include identifying a call to a mobile device, determining whether the call comprises call content data intended for the mobile device, receiving a content confirmation from the mobile device, initiating an active session and a time to live (TTL) associated with the call content data, and forwarding the call content data to the mobile device when the call includes call content data associated with the caller.

The method also provides that when the call is determined to not have call content data, the call is connected without retrieving call content data. The method also includes identifying an active status associated with the active session, and forwarding updated content to the mobile device during the active session and prior to expiration of the TTL, and responsive to the active session terminating, blocking additional content from being sent to the mobile device. When the TTL expires, the call content data forwarded to the mobile device is revoked. The call content data includes a caller identifier and call content data, which includes location information, caller identification information, caller image data, and caller audio data. The TTL includes a fixed number of seconds between 10 and 60 seconds.

Figure 7D:
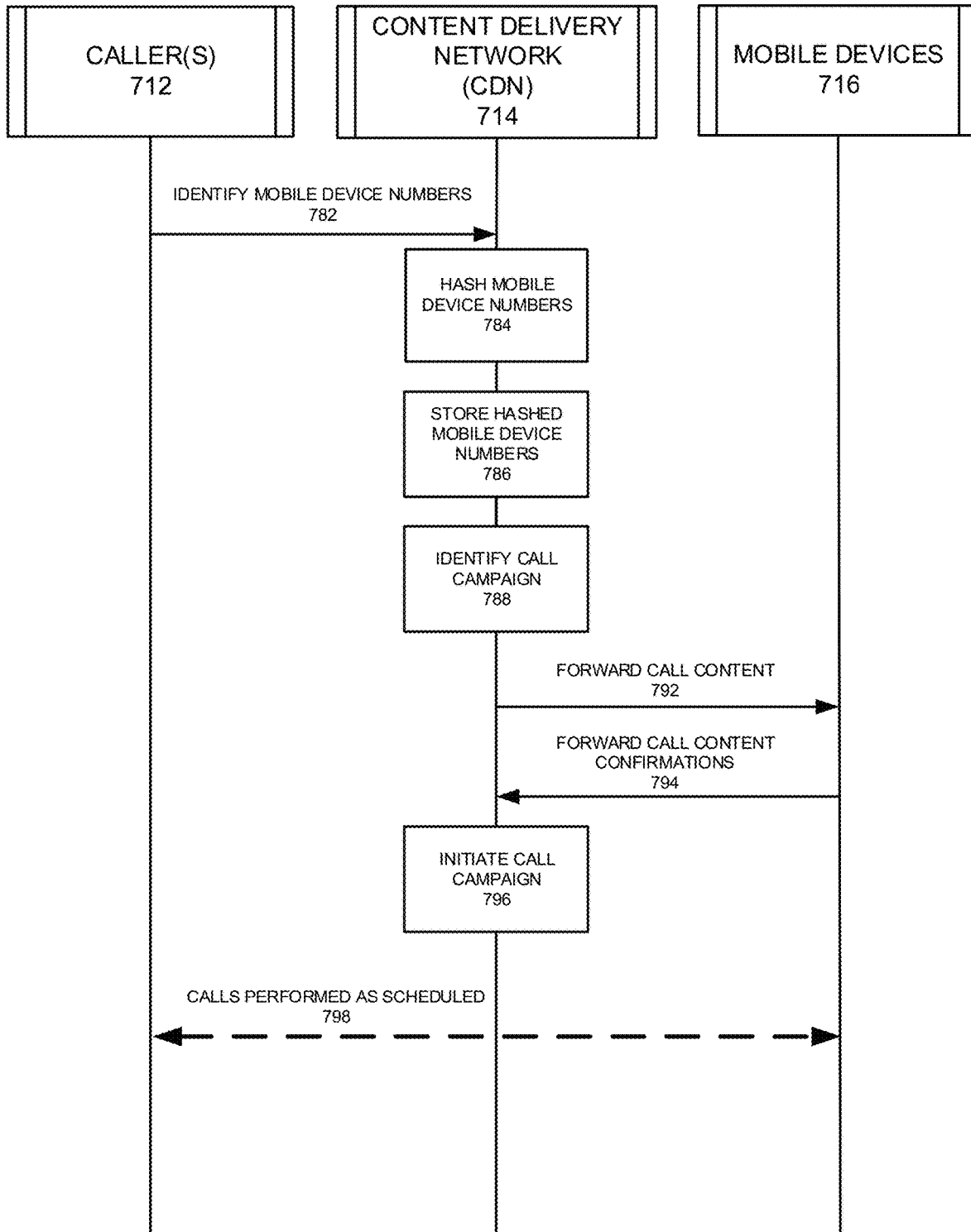
FIG. 7D illustrates a system network configuration that provides a call campaign setup to various mobile devices with call content delivery according to example embodiments.

FIG. 7D illustrates a system network configuration that provides a call campaign setup to various mobile devices with call content delivery according to example embodiments. Referring to FIG. 7D, the method 780 includes identifying a plurality of mobile device telephone numbers associated with a plurality of mobile devices 782, forwarding the plurality of mobile device telephone numbers to a content delivery device, hashing the plurality of mobile device telephone numbers 784, storing the hashed plurality of mobile device telephone numbers in the content delivery device 786, identifying a scheduled call campaign to the plurality of mobile devices 788 and forwarding call content 792 associated with schedule call campaign to the plurality of mobile devices prior to calling the plurality of mobile devices. Responsive to receiving confirmations 794 that the content was successfully forwarded to the plurality of mobile devices, initiating a calling device to begin calling the plurality of mobile devices as part of the campaign 796. The calls may then be dialed 798 by a calling device as part of the caller facility, such as an enterprise calling facility.

The scheduled campaign may include a date to call the plurality of mobile devices, the plurality of mobile device telephone numbers and content identifiers which identify the content to load during calls placed to the plurality of mobile devices. the CDN 714 performs hashing of called and calling device numbers for the called device telephone numbers associated with the calling device(s), and storing the hashed calling device telephone numbers in the content delivery device. The method may also include determining call preferences to apply to each of the plurality of mobile devices, and retrieving the call content based on the call preferences. The retrieving of the call content includes retrieving one or more of short message service (SMS) image data, call image data, caller identification data. The method may also include transmitting a request for authorization information to one or more of the mobile devices prior to calling one or more of the mobile devices, receiving authorization information from the one or more mobile devices, and calling the one or more mobile devices responsive to receiving the authorization information.

Figure 8:
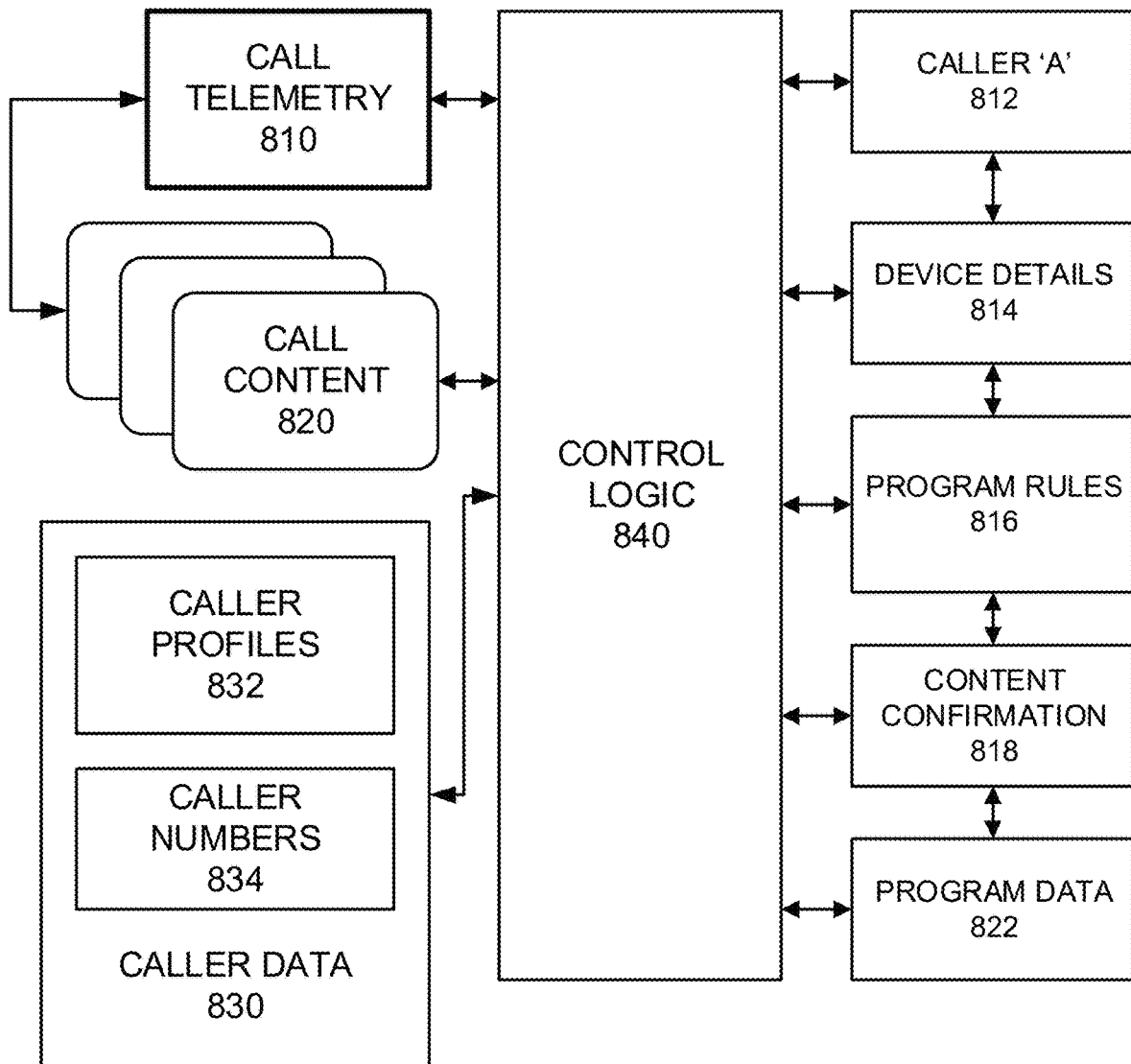
FIG. 8 illustrates a logic diagram with example data input and output parameters for performing call management according to example embodiments.

FIG. 8 illustrates a logic diagram with example data input and output parameters for performing call management according to example embodiments. Referring to FIG. 8, the system configuration 800 may include a control logic module 840, such as a processor that processes input data, such as call telemetry 810, call content 820 and caller data 830 (i.e., caller profiles 832 and caller/callee numbers 834). The output of the logic module 840 may include identifying caller 'A' numbers 812, device details of recipient devices 814 assigned to callers/callees, certain program rules 816, content confirmations 818 that the content was sent and received and program data 822 for accessing and calling mobile devices according to campaign specifications.

The operations of a method or algorithm described in connection with the embodiments disclosed herein may be embodied directly in hardware, in a computer program executed by a processor, or in a combination of the two. A computer program may be embodied on a computer readable medium, such as a storage medium. For example, a computer program may reside in random access memory ("RAM"), flash memory, read-only memory ("ROM"), erasable programmable read-only memory ("EPROM"), electrically erasable programmable read-only memory ("EEPROM"), registers, hard disk, a removable disk, a compact disk read-only memory ("CD-ROM"), or any other form of storage medium known in the art.

Figure 9:
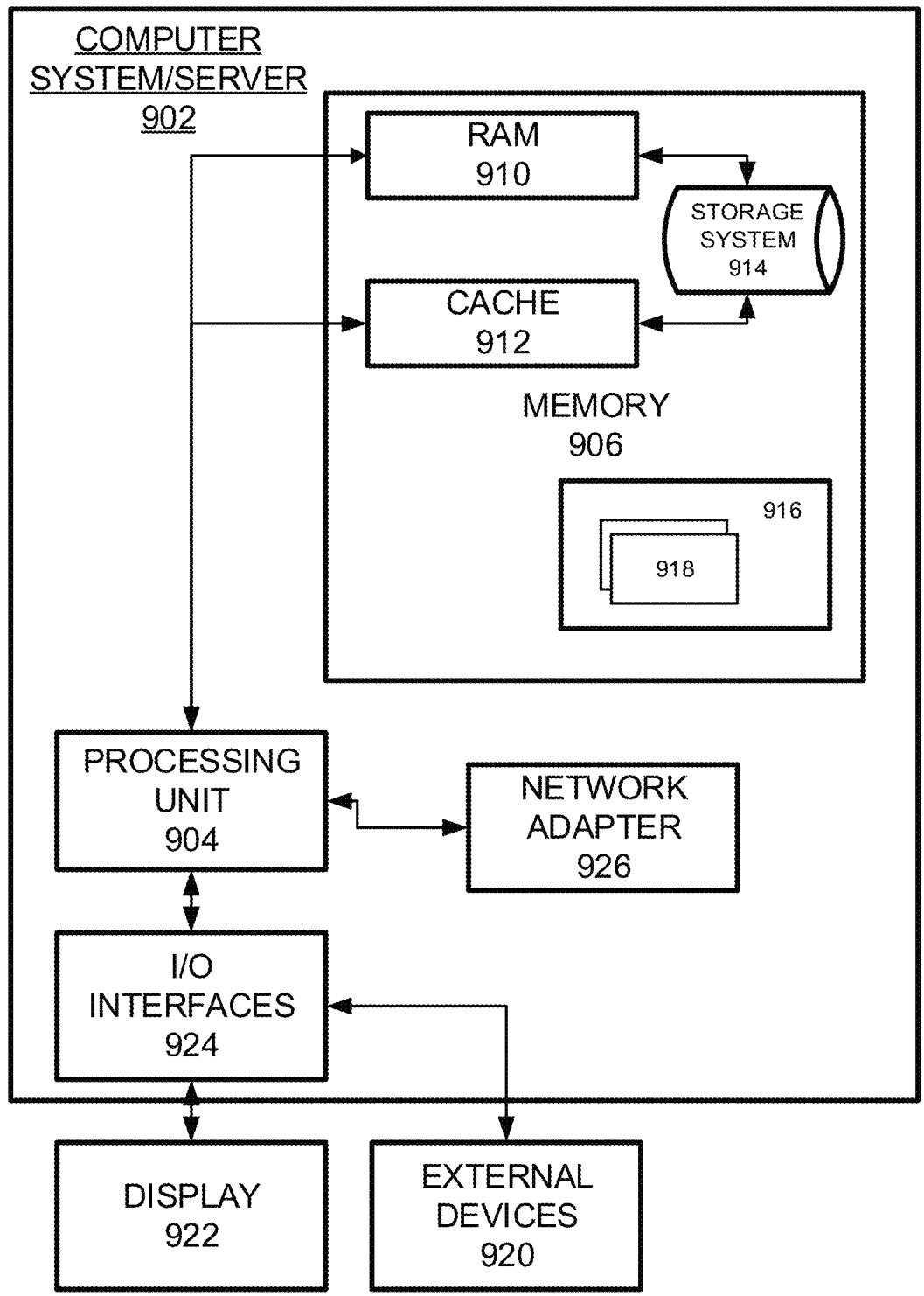
FIG. 9 illustrates an example network entity device configured to store instructions, software, and corresponding hardware for executing the same according to example embodiments.

FIG. 9 is not intended to suggest any limitation as to the scope of use or functionality of embodiments of the application described herein. Regardless, the computing node 900 is capable of being implemented and/or performing any of the functionality set forth hereinabove.

In computing node 900 there is a computer system/server 902, which is operational with numerous other general purpose or special purpose computing system environments or configurations. Examples of well-known computing systems, environments, and/or configurations that may be suitable for use with computer system/server 902 include, but are not limited to, personal computer systems, server computer systems, thin clients, rich clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 902 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 902 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 9, computer system/server 902 in cloud computing node 900 is shown in the form of a general-purpose computing device. The components of computer system/server 902 may include, but are not limited to, one or more processors or processing units 904, a system memory 906, and a bus that couples various system components including system memory 906 to processor 904.

The bus represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 902 typically includes a variety of computer system readable media. Such media may be any available media that is accessible by computer system/server 902, and it includes both volatile and non-volatile media, removable and non-removable media. System memory 906, in one embodiment, implements the flow diagrams of the other figures. The system memory 906 can include computer system readable media in the form of volatile memory, such as random-access memory (RAM) 910 and/or cache memory 912. Computer system/server 902 may further include other removable/non-removable, volatile/non-volatile computer system storage media. By way of example only, storage system 914 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to the bus by one or more data media interfaces. As will be further depicted and described below, memory 906 may include at least one program product having a set (e.g., at least one) of program modules that are configured to carry out the functions of various embodiments of the application.

Program/utility 916, having a set (at least one) of program modules 918, may be stored in memory 906 by way of example, and not limitation, as well as an operating system, one or more application programs, other program modules, and program data. Each of the operating system, one or more application programs, other program modules, and program data or some combination thereof, may include an implementation of a networking environment. Program modules 918 generally carry out the functions and/or methodologies of various embodiments of the application as described herein.

As will be appreciated by one skilled in the art, aspects of the present application may be embodied as a system, method, or computer program product. Accordingly, aspects of the present application may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present application may take the form of a computer program product embodied in one or more computer readable medium(s) having computer readable program code embodied thereon.

Computer system/server 902 may also communicate with one or more external devices 920 such as a keyboard, a pointing device, a display 922, etc.; one or more devices that enable a user to interact with computer system/server 902; and/or any devices (e.g., network card, modem, etc.) that enable computer system/server 902 to communicate with one or more other computing devices. Such communication can occur via I/O interfaces 924. Still yet, computer system/server 902 can communicate with one or more networks such as a local area network (LAN), a general wide area network (WAN), and/or a public network (e.g., the Internet) via network adapter 926. As depicted, network adapter 926 communicates with the other components of computer system/server 902 via a bus. It should be understood that although not shown, other hardware and/or software components could be used in conjunction with computer system/server 902. Examples include, but are not limited to: microcode, device drivers, redundant processing units, external disk drive arrays, RAID systems, tape drives, and data archival storage systems, etc.

Figure 10A:
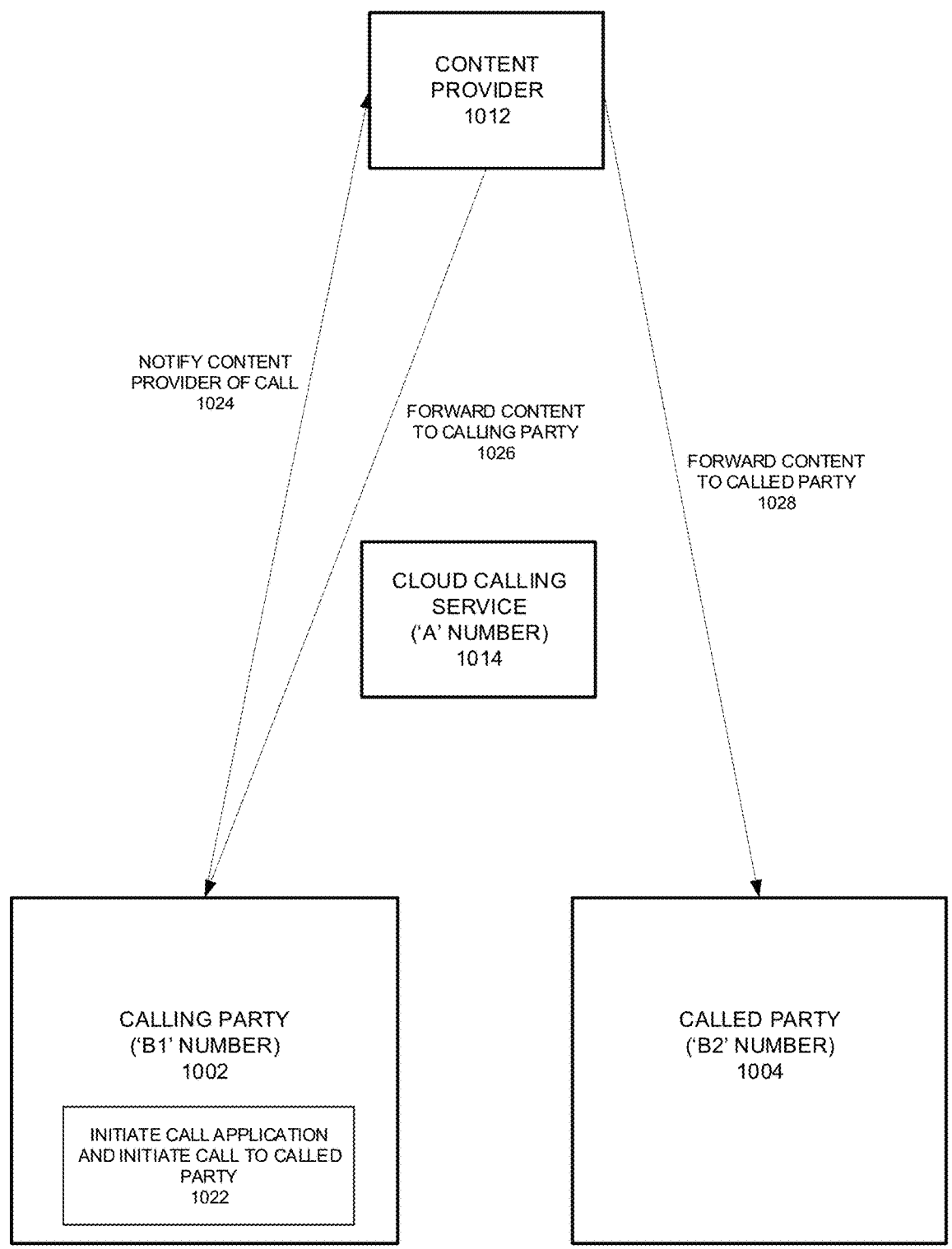
FIG. 10A illustrates an example call application according to example embodiments.

FIG. 10A illustrates an example call application according to example embodiments. Referring to FIG. 10A, the configuration 1000 includes a calling party 1002 attempting to communicate with a called party 1004 via a call event (i.e., dialed call). In this example, a call management application is used to provide enhanced content, such as images, textual information, video, etc., contemporaneously with a call. Also, a calling number ("A" number) and called numbers ("B" numbers) may be modified based on a third party calling service. For example, in this scenario the calling party 1002 would normally be the "A" number that initiates a call 1022 to the call application managed by the content provider server 1012 to reach the called party 1004, however, the "A" number of the calling party 1002 is replaced with the "A" number of the call service 1014, which may be a third party calling service/cloud calling service, etc. The call service may be solicited by the content provider 1012 to conduct the calls originally placed by the calling party 1002.

Continuing with this scenario, the call is placed 1024 by the calling party 1002, and the call is received and terminated at the content provider entity 1012. The content provider then identifies the calling and called parties and retrieves the appropriate content to share with each of those entities 1002 and 1004. For example, the calling party may receive image/text information about the called party, and the called party may receive image/text information about the calling party. The enhanced information (i.e., content) that is shared during such calls may vary depending on the configuration of each of the parties and their customized content profiles stored and managed by the content provider 1012. The content provider 1012 may then forward content to both parties of the original call, the content may be first forwarded 1026 to the calling entity 1002 and then forwarded 1028 to the called party 1004.

Figure 10B:
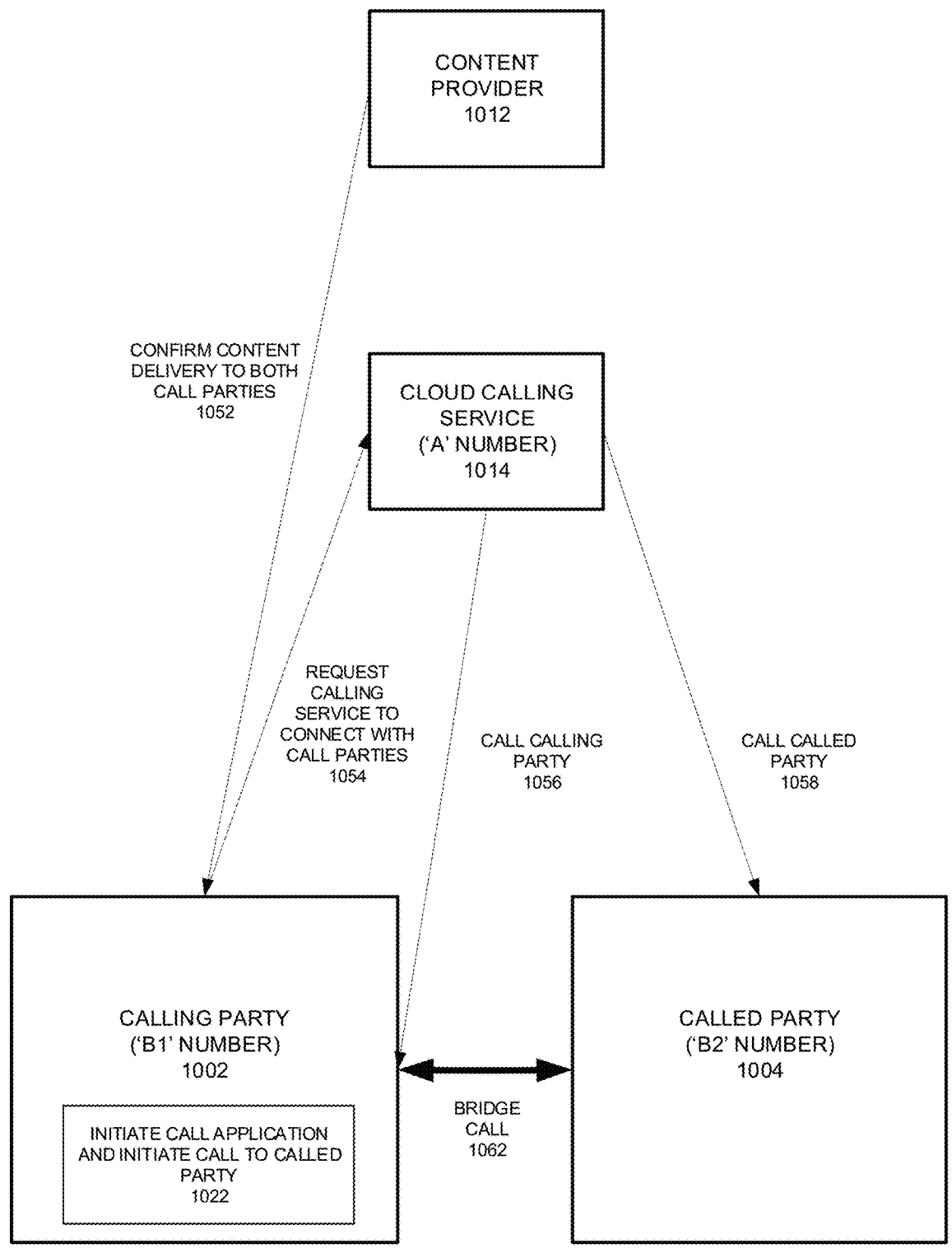
FIG. 10B illustrates another example of the call application using a third party calling service according to example embodiments.

FIG. 10B illustrates another example of the call application using a third party calling service according to example embodiments. FIG. 10B provides a continuation process 1050 of the previous scenario 1000 of FIG. 10A. Once the content is forwarded to the call parties, the original calling party call application operating on the calling party device (e.g., calling device, server, telephone, etc.) 1002, may receive a confirmation 1052 that the content was delivered from the content provider 1012, which may also receive a confirmation from both the calling entity 1002 and called entity 1004 prior to notifying the calling entity 1002 via an API message confirmation 1052 of the content delivery. Next, the calling party again transmits a call request, this time the call request (second call attempt effort by 1002) is not sent/intercepted by the content provider but instead is sent 1054 to the cloud calling service 1014 as routed via the call management application operating on the calling party device 1002. The calling service 1014 assigns its "A" number as the call origination number of the call, and then calls 1056 the calling party 1002 as the call recipient with a destination number of "B1". The calling service 1014 then calls 1058 the called party 1004 using the assigned "A" number of the calling service 1014 and the "B2" number assigned to the called party 1004. Once both calls are answered, the calls are bridged together 1062 to establish a communication between the two call entities.

Figure 11:
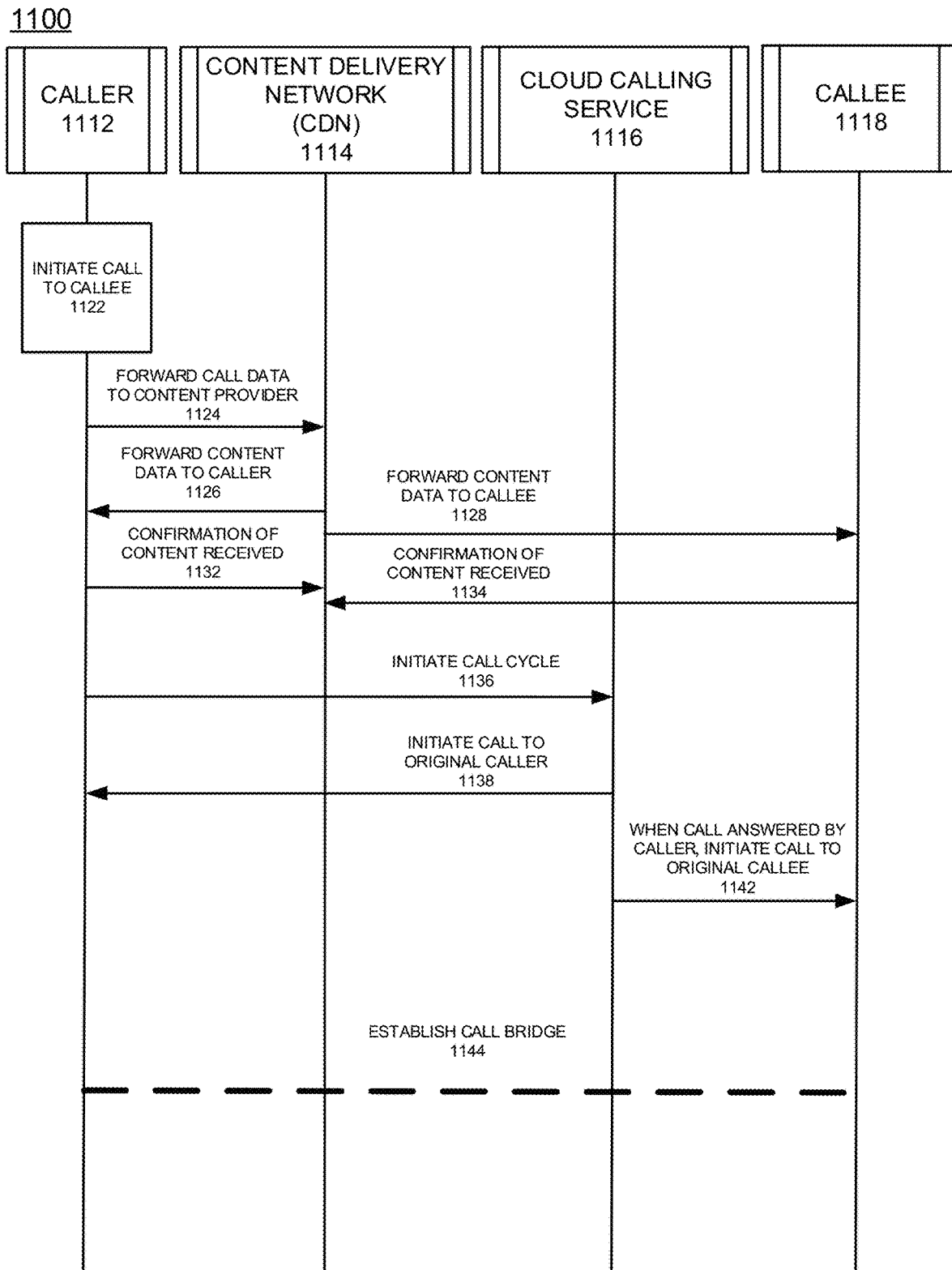
FIG. 11 illustrates an example system diagram of a call being initiated and managed by a content provider and third party calling service according to example embodiments.

FIG. 11 illustrates an example system diagram of a call being initiated and managed by a content provider and third party calling service according to example embodiments. Referring to FIG. 11, the configuration 1100 includes the caller entity 1112, which may be a mobile device or other calling device, a content delivery network 1114 which may be the service responsible for managing the calls and the content shared during, before and after a call is made, the cloud calling service 1116, which may be a call routing service, such as a cloud-based service, PSTN, etc., and a callee 1118, which may be any call recipient device.

In operation, the caller device 1112 may initiate a call 1122 via the call management application intended for a callee 1118 by dialing the callee's number or retrieving the number from a contact list or other data source. The call initiation may be sent 1124 from the caller 1112 to the content delivery network server 1114 which may intercept the call by terminating the call or placing the call on hold until various operations have occurred such as the distribution of enhanced call content. The call may be intended for a called entity, such as the callee 1118 as indicated by a callee number in the call message information. Responsive to receiving the initiated call, the content network (server) 1114 may perform initiating an application programming interface via the server to transmit 1126 first call content data to the calling entity 1112 and second call content data 1128 to the called entity 1118, and responsive to receiving one or more confirmations 1132/1134 that the first call content data and the second call content data were received, initiating a call service 1136 to establish a call session via a calling service 1116, with the calling entity and the called entity.

In this example, since the caller/calling party 1112 has already initiated a call 1122, the process of initiation of a call cycle 1136 is an automated feature where the content is confirmed to be delivered to both call parties and then the call is essentially restarted or is sent a second time by the caller entity 1112. This time the call request is not intercepted by the content delivery server 1114 but is instead sent to the cloud calling service server 1116 which sends a first call leg beginning with the call leg 1138 that is sent back to the caller 1112 entity. In other words, the caller entity 1112 submits a call with its own number as the "A" origination number, and that call is terminated and a new call is sent back 1138 to the caller which has a new "A" number assigned by the cloud calling server 1116. Then, when the first call leg 1138 is sent back to the caller 1112 and is confirmed as answered and active, the second call leg 1142 is sent to the callee 1118. Once the connection is made as two separate call legs, the call legs are connected to establish a call bridge 1144. The "A" number for both call legs is the same "A" number which is assigned from the call (cloud) service server 1116, and the "B" numbers for the two call parties are assigned as "B1" for the caller 1112 and "B2" as the callee 1118. The called party does not have an account of the actual caller number since the "A" number is assigned from the calling server 1116.

In additional operations, the initiating of the application programming interface via the caller device during the initial call 1122 may include initiating a function call message that includes the calling entity phone number and a called entity phone number. The process may also include transmitting the first call content data via the content delivery network server 1114 while having an origination phone number assigned to the call service entity and also having a destination number of the calling entity phone number for this procedure. The first call content data may include one or more of an image and textual data to display on the calling entity. The process may also include transmitting the second call content data, having an origination phone number assigned to a call service entity and the called entity phone number, and the second call content data further includes one or more of an image and textual data to display on the called entity. The content data for each party may be different or the same.

The process may also include receiving an initiation request from the calling entity to begin the initiated call, this may be identified as a second request after the initial call request to the content server. The second request will bypass the content delivery server and go to the cloud calling server 1116. This can then be used for transmitting a first call leg to the calling entity, and when the first call leg is answered by the calling entity, a second call leg is transmitted to the called entity. Responsive to connecting the first call leg and the second call leg, the first call content data may be loaded on the calling entity and the second call content data may be loaded on the called entity in lieu of an upcoming call. The call legs are then bridged to establish the call session.

Figure 12:
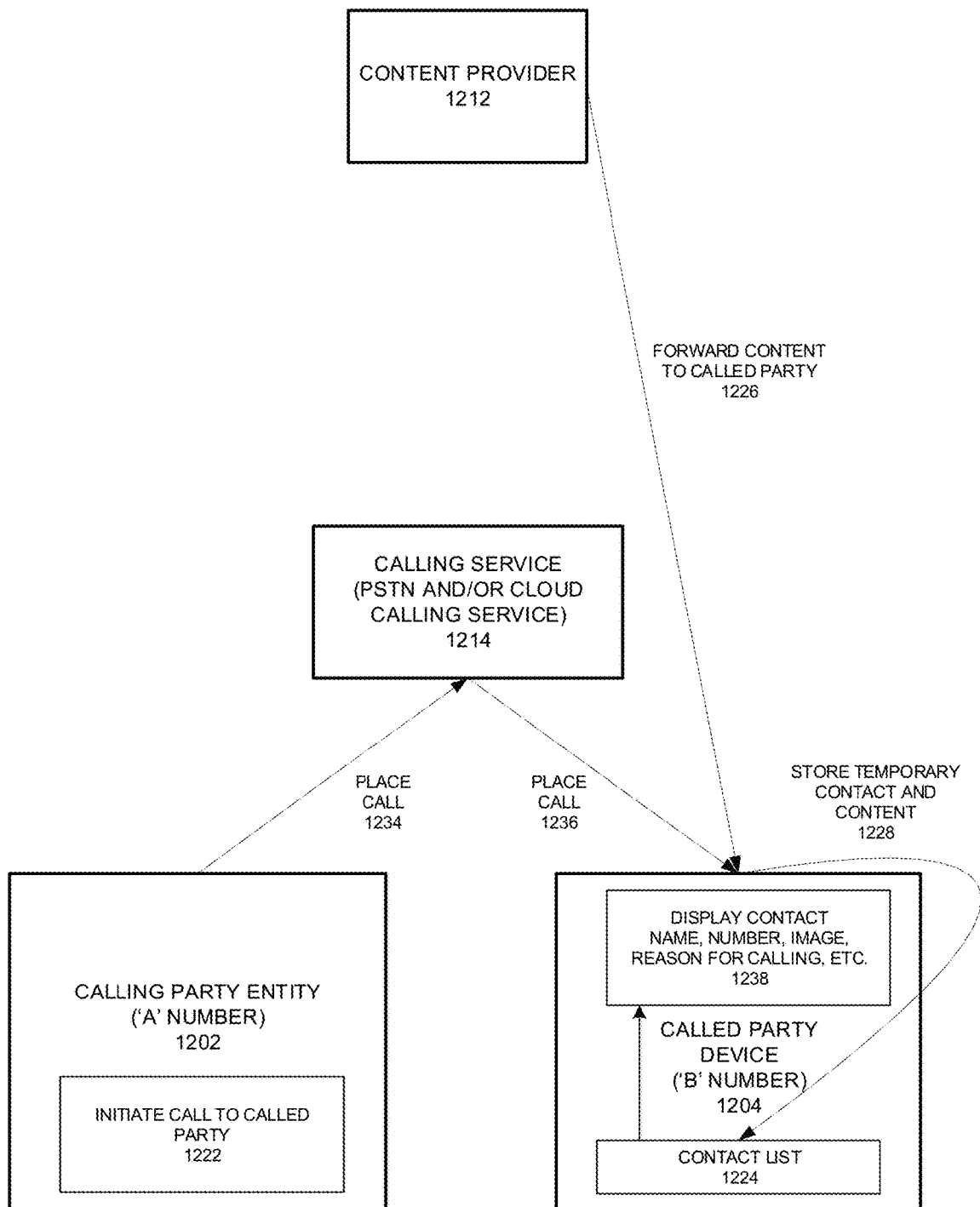
FIG. 12 illustrates an example network configuration for forwarding a temporary contact to a called party according to example embodiments.

FIG. 12 illustrates an example network configuration for forwarding a temporary contact to a called party according to example embodiments. Referring to FIG. 12, the call content forwarding procedure 1200 enables call related content to be forwarded/pushed to various identified 'B' called parties, such as customers with a call content enabled application operating on their mobile devices. The call content may include a calling party name, number (e.g., 15 character CNAM, 64 character CNAM, etc.), logo (image), advertising information, links, textual information, etc. Also, certain call content data may have detailed information, such as a purpose(s) for the call, that is displayed on the called party mobile device 1204.

In operation, the call content may be sent from a content provider 1212 per the configuration specified by the calling party (e.g., enterprise entity). For example, the calling party may require each of its client devices, such as called device 1204, which are identified from a database, to be populated with the updated call content as it is updated on the calling party side, such as via a call server or calling device 1202. The content provider may forward the updated information to the call application operating on the called party device 1204. In one example, the call content may specify a contact list update to include a calling name and other information that is added to the contact list 1224 of the called device 1204. The contact list update may be temporary and may be removed after a time period (time-to-live (TTL)) has lapsed, which is also included with the call content 1226 forwarded to the called party.

Upon receiving the call content at the called party device 1204, the call content may include a set of information that is stored 1228, such as the contact list information stored in the device contact list 1224. Once the content is forwarded, stored and added as a contact, the initiated call 1222 may be placed 1234 from the calling number via the calling device 1202 (e.g., server, calling device, etc.). The calling service provider (e.g., carrier, cloud service, etc.) 1214 may receive the call and forward a call leg 1236 to the called party. The call being received may cause the called party device 1204 to invoke the call list matching procedure to determine whether the call is from a known member contact entry of the contact list. If so, the information stored via the previously forwarded call content may be retrieved and displayed with the connected call.

In one example, after placing the call to the 'customer' called party 1204 over the PSTN 1214, when the called device 1204 receives the call from the calling entity 1202, the call receiving device 1204 displays one or more of a name, number, textual information and/or a graphical image as retrieved from the pre-stored contact/call content stored on the called device 1204. Along with information about the calling party and a brief description of the purpose of the call, the temporary contact information enables callers to brand their calls as they are sent to customers in a secure and trusted manner. Since the various information is displayed when the call is received, the purpose of the call and related caller information permits the called party 'customer' to make an informed decision whether to answer the call or ignore the call.

When the calling party (enterprise) backend platform sends call content to the called device 1204 the call application on the called device may use a software development kit (SDK) loaded into the call application and may require appropriate permissions enabled by the user of the mobile device. The call application SDK on the mobile device 1204 receives the call content and then inserts a new and temporary contact into the native call contact list. After the call content is sent, a confirmation may be required at the content provider 1212 in order to ensure the content was received. When calls are sent, the carrier network service 1014 may place the call to a phone dialer application on the device 1204. For certain types of mobile devices, there may be a stock dialer that is distinct for each OEM, such as SAMSUNG, GOOGLE, LG, SONY, etc. Each of those dialers will reference the contacts. In addition to the carrier network, VoIP services and application may check the contacts as well and display the contact 1238, along with other information, for an incoming call.

In another example of temporary call contact management, a contact may be pushed for various different numbers. For example, instead of creating a temporary contact for one telephone number where the calling party is identified for callback purposes, there may be two or three phone numbers which are available to identify the calling party. In the event that one of the plurality of numbers is already assigned to the called (callee) phone under an existing contact registered in the contact list application, then the new contact would be created but would only include the two numbers that were not already stored on the called device.

Figure 13:
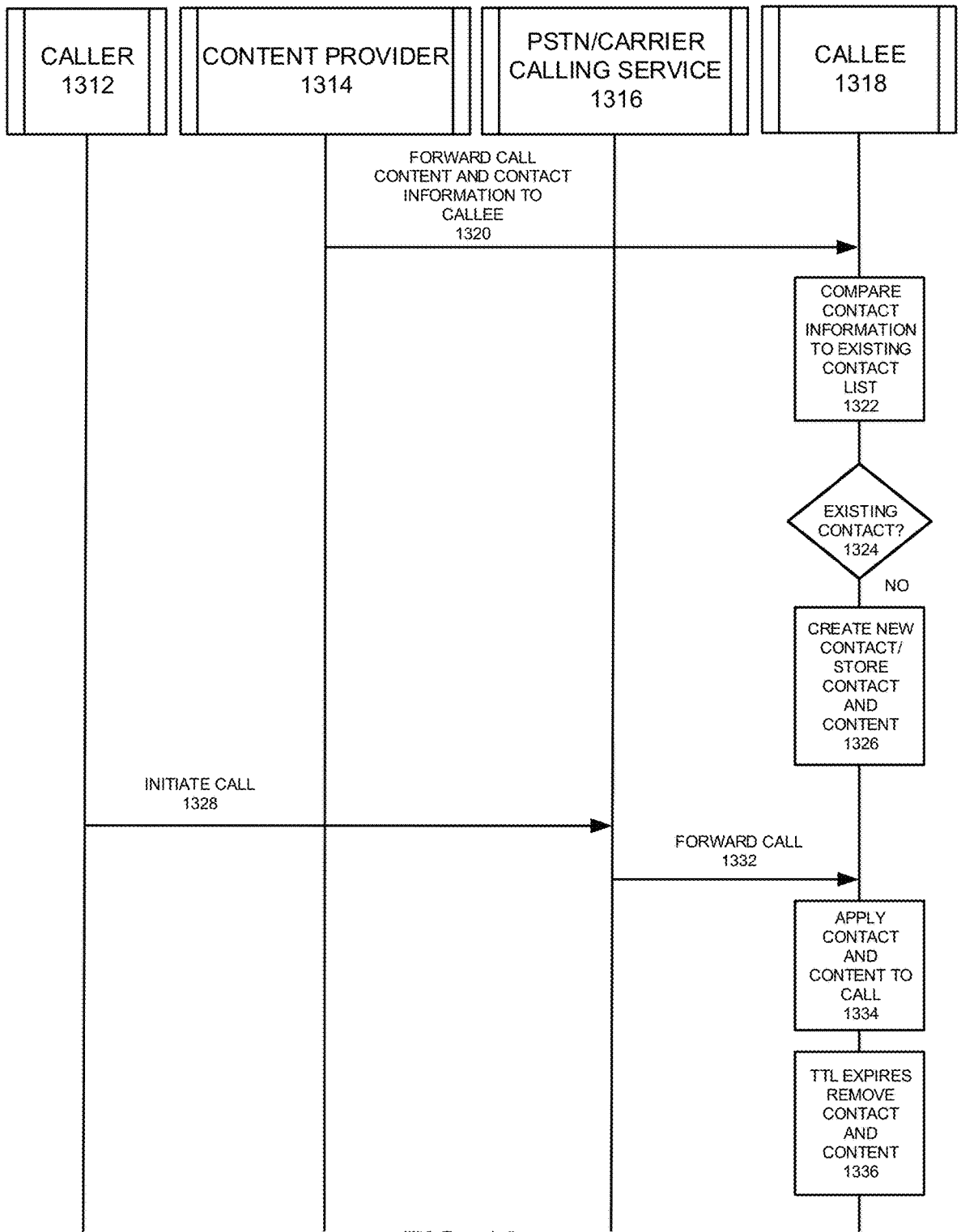
FIG. 13 illustrates an example system diagram of a call content and contact forwarding event according to example embodiments.

FIG. 13 illustrates an example system diagram of a call content and contact forwarding event according to example embodiments. Referring to FIG. 13, the system 1300 includes a caller device/server 1312, a content provider entity (server/database) 1314, a call carrier service 1316 and a callee 1318, such as an end user device (mobile device). Prior to the call being placed to the callee 1318, the content provider 1314 may forward the call content and/or contact to the callee 1318. The action to perform the content forwarding 1320 may include identifying a new contact created by the caller 1312 and uploaded to the content provider 1314, which may then need to update all the end users (callees) which are subscribed to receive the updated information. For example, if an enterprise caller 1312 is a large credit card company that regularly calls its credit card account holders on their mobile devices, then those known callees along with their names and telephone numbers may require an updated call content push notification with any call content changes since the last push notification. Such changes may include a new purpose for calling, a new department that recently added the callee identification information (e.g., card services, card promotions, security department, etc.).

The SDK on the callee device 1318 may process the push call content notification by performing a comparing operation 1322 to check as to whether the device's contact list already has a contact with the information (telephone number, name, additional textual information, etc.) that was received in the call content notification. If so, then the process ends and the call content is either disregarded or the additional content not previously stored is stored under the same contact profile in the contact list. If the forwarded contact is not an existing contact 1324, then the new contact is created and the corresponding call content is stored 1326 which pertains to that content. Also, a life cycle duration or TTL may be sent to indicate when the information should be removed along with the temporary contact. In general, a contact may only exist for a few days or until the calls are expected to stop being sent to the callee.

Once the temporary contact is inserted into the callee device native contact list, when a call arrives at the user's device from the caller 1312 and the known number is identified, the native operating system dialer application that is used to answer the incoming call will identify that there is a contact which matches the incoming call. The contact information may be displayed including a caller name, variable text (purpose of call), and any image data. When the TTL is reached for the call content, the clean-up (deletion of the contact) occurs. The TTL may be initiated at the installation of the contact and may be an ongoing clock or timer that maintains its time count until the expiration period is completed (e.g., 24 hours, 3 days, 14 days, etc.). For different operating systems associated with different mobile devices, the TTL may be required to be managed by a server which then sends a delete notification at the end of the TTL time cycle to have the notification removed. In other operating systems, the clean-up push notification may not be necessary and the operating system of the mobile device may be able to maintain its own contact deletion event pending a scheduled date assigned by the TTL information sent with the original call content. In one example, the iOS devices associated with APPLE may require a notification from a third party to instruct the SDK on the mobile iOS device to delete the temporary contact information. On an ANDROID operating system, the TTL may be sent with the push notification of the call content and the SDK can automatically delete the temporary contact at the maturation of the TTL time cycle.

In one example, the call content is pushed to the mobile device ahead of a call with an end date/time. At that point of reception and installation, the call contact is created on the mobile device. Thereafter, the calls 1328 which arrive from the caller 1312, may be received and processed by the carrier 1316 which forwards 1332 the calls to the subscriber callees 1318. The contact is applied along with the call content when the calling number is matched with the temporary contact 1334. Upon expiration of the TTL, the contact is removed along with any additional content 1336.

In another example, the call content that is pushed to the mobile device ahead of the call may have a start date/time. The mobile device does not create the contact until the start date/time has matured. In another example, the call content is sent to a queue in the content provider 1314 where it stays until the start date/time is identified as having matured. At that point the call content is sent to the mobile device. This example uses the same call content "push" approach as demonstrated in FIGS. 11-12, however, there is an additional step of holding the call content until a future start date/time is fulfilled prior to forwarding the call content.

When removing the contact information from the contact list, the application on the mobile device removes the content when the end date/time has matured and/or when the next phone call occurs. The approaches to removing the contact information vary since different operating system may have special permissions that others do not require. Another approach to removing the contact information is performed by the application software scanning for any contacts on the phone that are past their end date/time every time the application "wakes up" or is accessed. The call content may be sent over the HTTPS Internet protocol from the content provider backend to the software application on the mobile device.

One example method of operation may include receiving call content at a mobile device, and responsive to receiving the call content, adding a contact identifier to a contact list of the mobile device, receiving a call from a calling device at the mobile device, pairing the calling device with the contact identifier, and displaying the call content and the contact identifier during the call. After the call is completed, the contact identifier may be removed from the contact list automatically or based on a specific content removal criteria.

The method may also include identifying the contact identifier as being part of the received call content, and the call content includes textual information, a telephone number and an image. The method may also include determining whether the contact identifier matches an entry in the contact list, and when the contact identifier does not match any entry in the contact list, adding the contact identifier to the contact list. Also, responsive to receiving the call, retrieving the contact identifier, and the process may include applying textual information, an image and a telephone number to a display of the mobile device. The process may also include identifying a time to live duration from the call content, when the time to live duration has expired, removing the contact identifier and the call content from the mobile device receiving a notification at the mobile device when the time to live duration has expired, and responsive to receiving the notification, removing the contact identifier and the call content.

According to other example embodiments, a process to send an enhanced call information notification to an enhanced call information-enabled device may require that the entity originating the data 'push' notification identify a particular profile dataset along with the 'B' number (called party) and any variable text to be displayed to that called party. The profile(s) may already contain information about the 'A' number entity (calling party) and any other data, such as images associated with the push to be sent and the time-to-live parameter (TTL) defining how long the content is to be stored/displayed, etc. When such content notifications are sent, the information used to select which content profile to send for which call origination parties and call destination parties may be identified by content selection procedure performed by a content management server. For example, the enhance call content backend application may store information about each registered enhanced call content-enabled device and other information such as which content is appropriate for which call recipient devices, appropriately sized image(s) to send to each device, etc.

Instead of having a static enhanced call content profile that is sent and updated periodically, a dynamic enhanced call content profile selection and forwarding procedure may permit the selection of one or more profiles among a plurality of profiles based on certain information. The process may also permit the forwarding and provisioning of appropriate data to the appropriate parties (e.g., 'B' numbered devices) prior to a next call being placed. The process begins with the identification of a calling entity (i.e., caller, calling party, enterprise, etc.) which is generally performed based on the 'A' number among other information about the calling entity.

According to example embodiments, a function call may enable an application to perform a function call to an enhanced call content backend system and pass certain information, such as 'A' number, 'B' number and variable text. The call content backend uses the 'A' number identified to match to a content profile already established with specific content (e.g., CNAM, text, images, videos, links, etc.) prior to initiating a content push.

According to one example embodiment, the dynamic enhanced call content sharing may enable a calling party to call a called party utilizing an enhanced call content utilizing platform to generate a specific display experience for the called party even though the called party has the calling party in the called party's contact list. This approach enables the calling party to deliver a specific message to the called party's display during a native incoming call.

In another example embodiment, a calling party may desire to share a specific number and to have that number be displayed on the called party's device so that if the called party returns a call to the number the call is diverted to a call center rather than the calling party's device. Also, the calling party may desire to have enhanced content be displayed on the called party's device. For example, one configuration may include a landscaper organization with a name, logo, call center service, and various different employees each operating their own mobile device. The employees may call or send text messages (SMS) to customer 'B' numbers prior to arriving for a particular work day. The landscaping service may use an enhanced call content application to ensure customers view the appropriate text, images, and desired telephone number when a call is received, regardless of the employee that placed the call. The service may update his or her 'A' numbers in the backend dynamically. The employees of the service can use the application to place messages and/or calls to customers which will ensure the correct enhanced call content profile will be selected and displayed during a communication session between the parties (caller/callee).

Another example may include providing dynamic and/or default content for service provider types of businesses with clients of their own seeking to provide content to callers with additional business information customized for each client. For example, when a service entity such as UBEREATS provides drivers and recipients (waiting for their food orders) with content to identify the name of the business, there may be a need to share other information, such as the business in which they are sharing their services with, like TACO BELL or JOES PIZZA. Those clients may also desire to have their content shared with the UBER EATS content to create a hybrid content sharing experience for the end customers. The content for the parent company UBER EATS may be identified by using the application on the end customer device, however, when the customer selects a particular dining option, additional content may be shared regarding the number, the location, the logos, coupons, etc., offered by the service provider client.

Figure 14A:
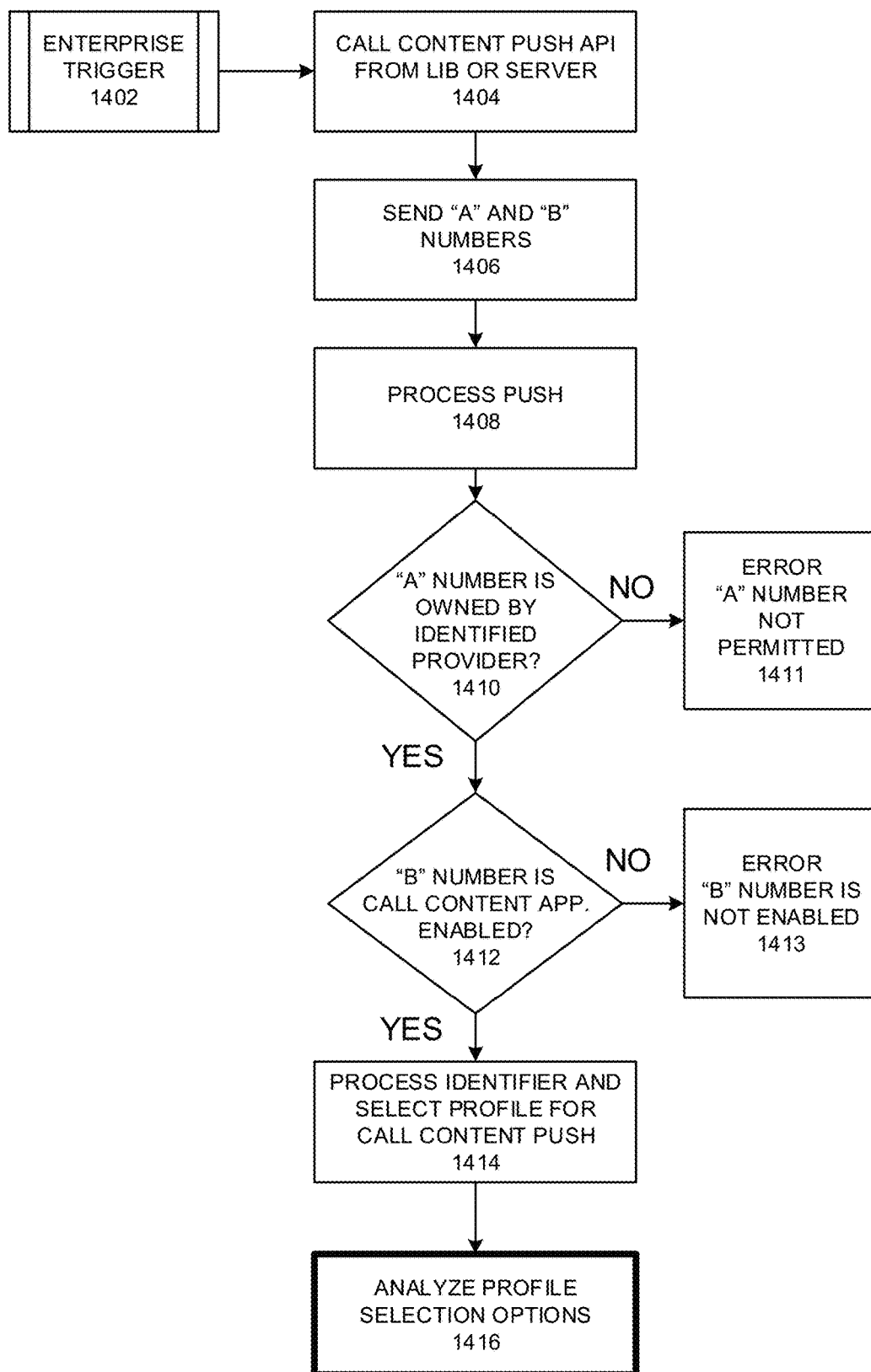
FIG. 14A illustrates an example flow diagram of a process for initiating an enhanced content push to a recipient device(s) according to example embodiments.

FIG. 14A illustrates an example flow diagram of a process for initiating an enhanced content push to a recipient device(s) according to example embodiments. Referring to FIG. 14A, the process 1400 may begin with an enterprise trigger 1402, such as an information header, certain types of information identified, such as a specific identifier associated with devices and/or parameters received from those entities using enhanced call content. For example, if an 'A' number is identified for an enhanced call content application customer, then that may be a trigger that invokes a content push API to activate an enhanced call content transmission to the one or more 'B' devices subscribed to the service. The enterprise trigger 1402 may also be caused by a service invocation. For example, a 'B' device may order food from a particular content provider entity (e.g., Pizza Shop) to be delivered by a particular service provider (e.g., Food Delivery XYZ—similar to LIBER EATS). The ordering may cause an enterprise trigger 1402 to occur and that creates a call content notification push to be selected according to a particular profile and sent.

In operation, the trigger may invoke a call content API to activate and seeking information from a library (LIB) or server 1404, the content may be automatically identified, selected, and paired with the service provider/content provider profile selected. This may include name, logos, text information for the service and the specific company where the food was ordered. The profile(s) can be sent together to provide enhanced call content to the 'B' device. In order to select the correct information and profile for content sharing, the known information is used to provide the correct pairing of content, and this begins with the 'A' and 'B' numbers 1406 of the caller/callee. The information is used to process a push 1408. The 'A' number may be examined to identify whether the number is owned by an identified provider 1410. This may include the service provider and/or the content provider of the service being provided to the end user 'B' device. If not, then the process ends 1411. Another determination may include determining whether the 'B' number represents a party that is call content enabled, such as a party that uses the enhanced call content application 1412. If not the process ends 1413. Once the 'A' and 'B' number are screened, the identifier information may be used to select an enhanced call content profile to forward 1414 to the call recipient. This process may include analyzing profile selection options 1416 depending on the types of information available to be processed by the application server.

Figure 14B:
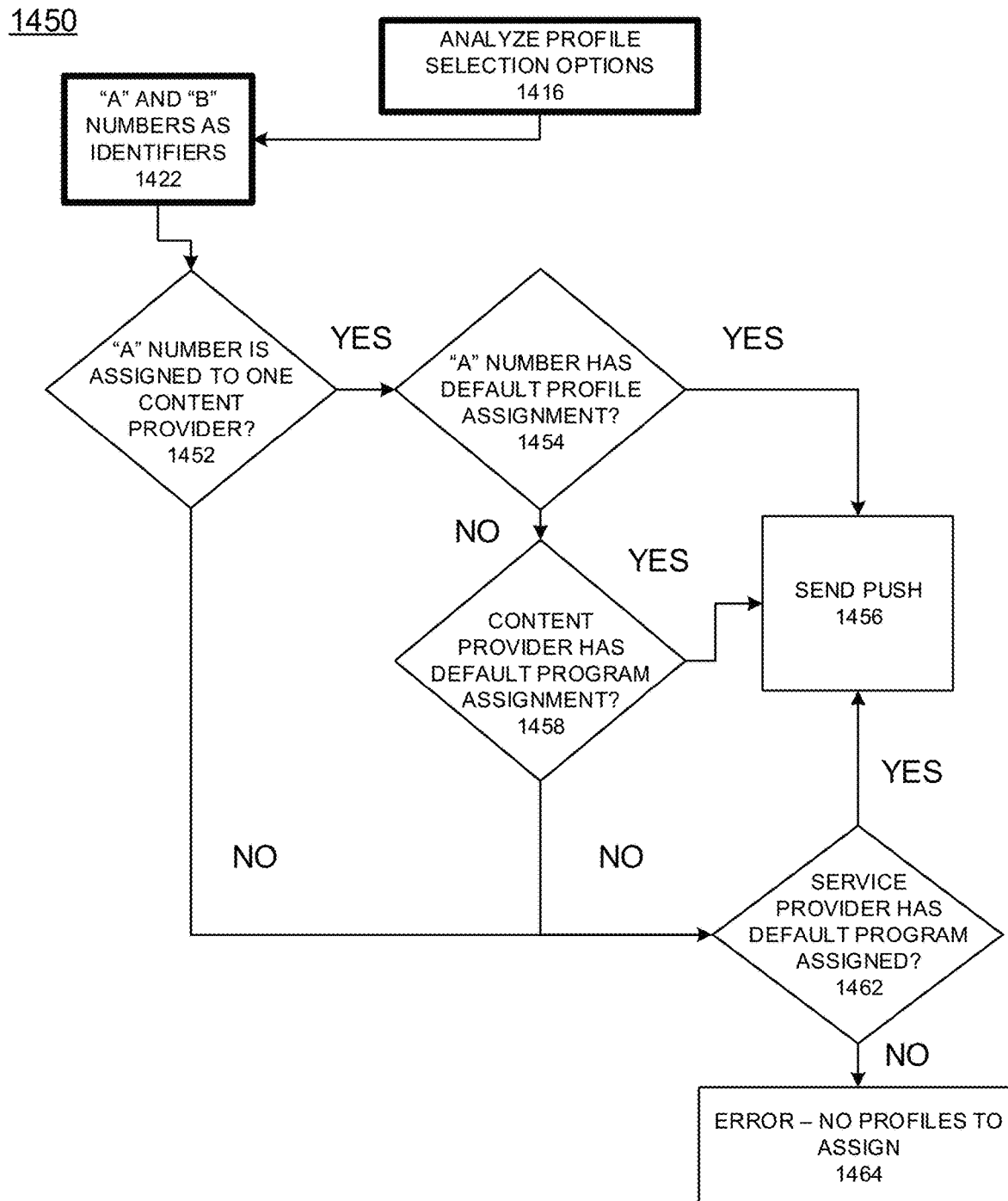
FIG. 14B illustrates an example flow diagram of a process for initiating an enhanced content push to a recipient device(s) based on device numbers according to example embodiments.

FIG. 14B illustrates an example flow diagram of a process for initiating an enhanced content push to a recipient device(s) based on device numbers according to example embodiments. Referring to FIG. 14B, the example diagram 1450 continues from operation 1416 as one of three scenarios of operations which may be used to select enhanced call content and forward it to an end user device. In this scenario, when the information identified is merely the 'A' number and 'B' number, then the process 1422 may determine whether the 'A' number is assigned to one specific content provider or not 1452, if not the content provider identified may be examined 1462 to identify a particular profile of enhanced call content. If however, the 'A' number is identified as being assigned to a particular content provider then the 'A' number may have a default profile assignment 1454 which is then selected as the basis for the enhanced call content to be sent 1456 to the 'B' device. Additionally, if the content provider has a default assignment 1458 and the 'A' number does not, the enhanced call content is sent 1456 based on the default assignment. If no assignments of profiles can be determined the result is an error 1464.

Figure 14C:
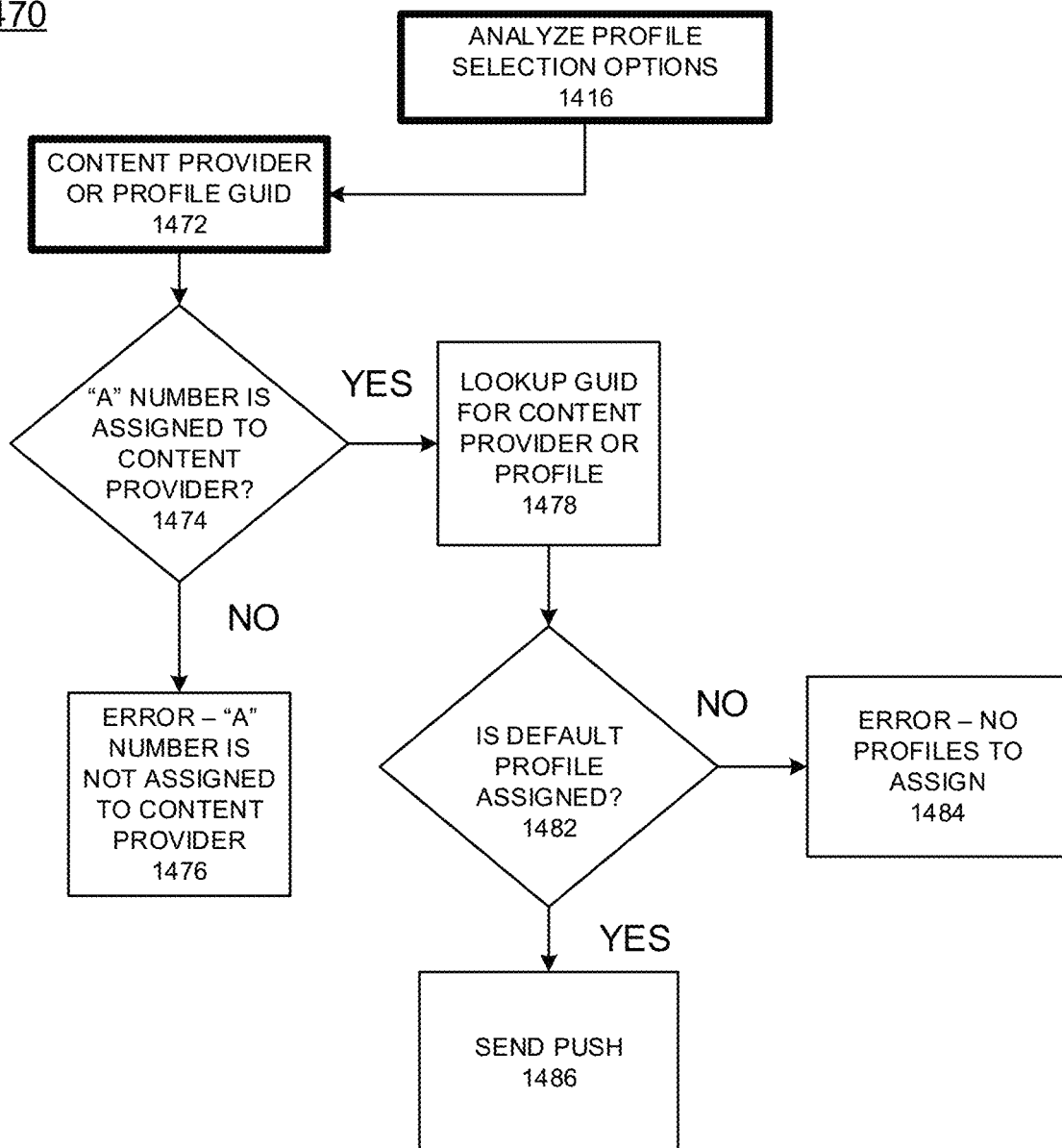
FIG. 14C illustrates an example flow diagram of a process for initiating an enhanced content push to a recipient device(s) based on a content provider and/or profile identifier according to example embodiments.

FIG. 14C illustrates an example flow diagram of a process for initiating an enhanced content push to a recipient device(s) based on a content provider and/or profile identifier according to example embodiments. Referring to FIG. 14C, the example diagram 1470 continues from operation 1416 as another of three scenarios of operations which may be used to select enhanced call content and forward it to an end user 'B' number device. In this scenario, when the information identified is a content provider or profile assigned identifier (i.e., globally unique identifier—GUID), then the process 1472 may determine whether the 'A' number is assigned to one specific content provider or not 1474, if not the result is an error 1476. If however, the 'A' number is identified as being assigned to a particular content provider then the GUID assigned to the profile of enhanced call content 1478 or content provider may be looked-up to identify a profile which is then identified as default profile 1482, or not 1484, in which case an error results. If so, the profile is used as the basis for the enhanced call content to be sent 1486 to the 'B' device.

Figure 14D:
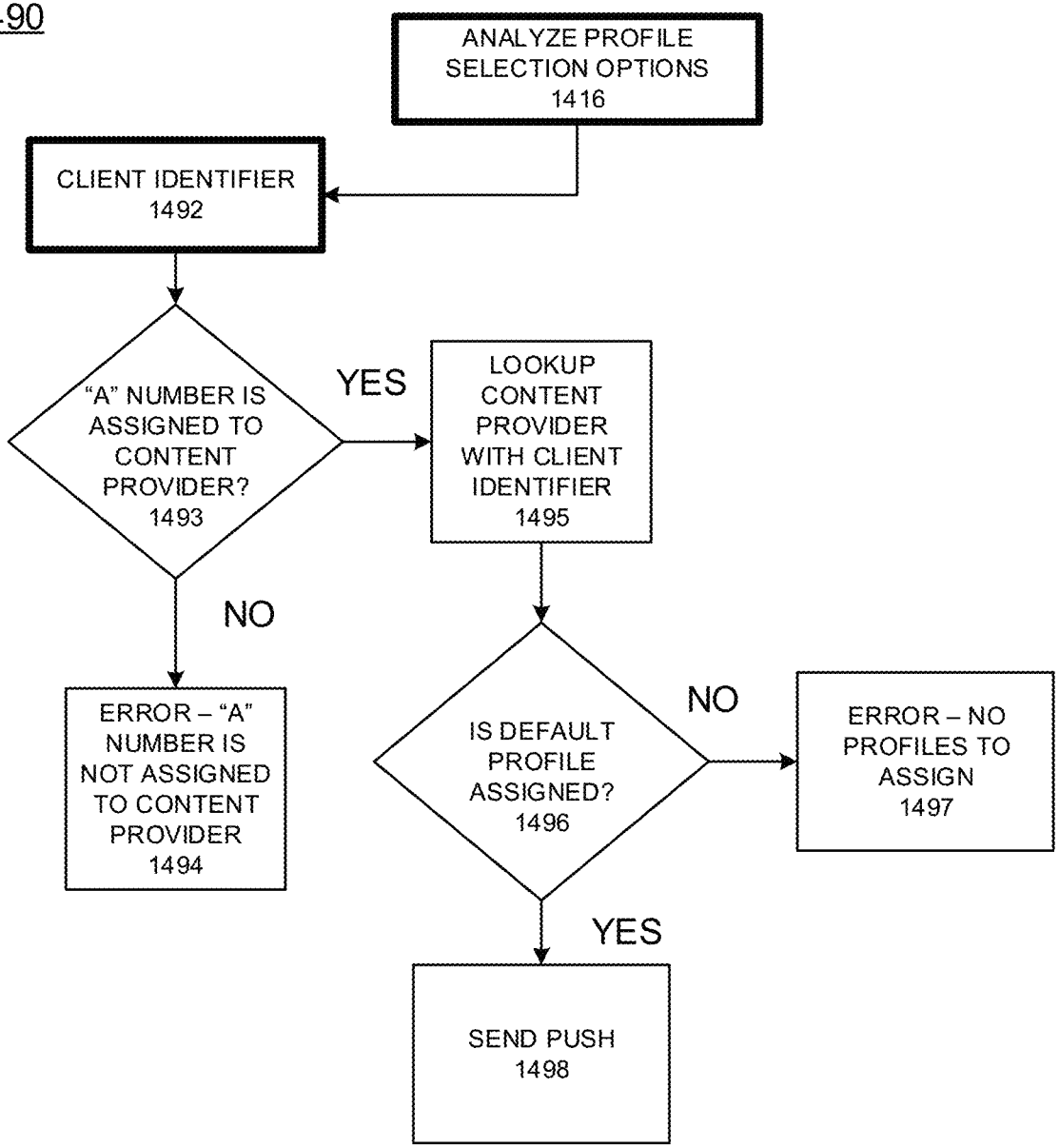
FIG. 14D illustrates an example flow diagram of a process for initiating an enhanced content push to a recipient device(s) based on a client identifier according to example embodiments.

FIG. 14D illustrates an example flow diagram of a process for initiating an enhanced content push to a recipient device(s) based on a client identifier according to example embodiments. Referring to FIG. 14D, the example diagram 1490 continues from operation 1416 as another of three scenarios of operations which may be used to select enhanced call content and forward it to an end user 'B' number device. In this scenario, when the information identified is a client identifier, then the process 1492 may determine whether the 'A' number is assigned to one specific content provider or not 1493, if not the result is an error 1494. If however, the 'A' number is identified as being assigned to a particular content provider 1498 then the client identifier assigned to the profile with enhanced call content 1495 may be looked-up to identify a profile which is then identified as default profile 1496, or not 1497, in which case an error results. If so, the profile is used as the basis for the enhanced call content to be sent 1498 to the 'B' device.

One example process may include identifying a calling device number of a calling device, such as a 'A' number, and matching the calling device number with a plurality of enhanced call content profiles any of which could be assigned to that particular 'A' number. The process may also include selecting, based on a particular call identifier (e.g., content provider identifier, service provider identifier, GUID, etc. billing code, business code, etc.), one of the enhanced call content profiles having enhanced call content intended for one or more call recipient device numbers, and forwarding the enhanced call content associated with the selected enhanced call content profile to one of the call recipient devices.

The process may also include determining the call identifier includes the calling device number and a call recipient device number assigned to the call recipient device, and selecting a default profile assigned to the call identifier as the selected enhanced call content profile, determining the call identifier comprises a content provider identifier, and selecting a default profile assigned to the content provider as the selected enhanced call content profile.

The process may also include determining the call identifier comprises a client identifier, and selecting a default profile assigned to the client identifier as the selected enhanced call content profile, and the selected enhanced call content profile is selected based on newly updated enhanced call content identified in the selected enhanced call content profile since a previous enhanced call content forwarding event. Also, the process may include determining the enhanced call content stored in the selected enhanced call content profile has changed since a last call was made to the call recipient device, and forwarding the enhanced call content to the call recipient device. In one example, one of the plurality of enhanced call content profiles includes a plurality of calling device numbers which are not assigned to the calling device and one other of the enhanced call content profiles which has the calling device number. The calling device number is one of a plurality of calling device numbers assigned to the selected enhanced call content profile.

When attempting to select an enhanced call content profile to forward to a recipient 'B' number device prior to establishing a call, the selection and pairing process of identifying the correct profile is primarily based on the 'A' number associated with the calling entity/enterprise entity. There may be various profiles assigned to that 'A' number, and the selected profile, at the time of the push notification, may also include a reference to a billing code, associated entity identifier, such as content/service provider pairings and other attributes. The identifiers may also include a GUID, client ID, company identifier, etc., the backend of the service and/or content provider can then establish multiple profiles for multiple instances. As a result, when a 'B' number device initiates a call to a call center for that organization, the call center server may reference, 'A' number, 'B' number and any associated IDs associated with that pairing of numbers to determine what content should be sent or what profile should be selected. The service provider may be called frequently for delivery service, however, each content provider profile for each business associated with the service provider may have a unique profile. In this case, the content provider profile must be identified along with the service provider profile to determine that the logo images, words, etc., are associated with that particular entity being sought by the 'B' device.

Although an exemplary embodiment of at least one of a system, method, and non-transitory computer readable medium has been illustrated in the accompanied drawings and described in the foregoing detailed description, it will be understood that the application is not limited to the embodiments disclosed, but is capable of numerous rearrangements, modifications, and substitutions as set forth and defined by the following claims. For example, the capabilities of the system of the various figures can be performed by one or more of the modules or components described herein or in a distributed architecture and may include a transmitter, receiver or pair of both. For example, all or part of the functionality performed by the individual modules, may be performed by one or more of these modules. Further, the functionality described herein may be performed at various times and in relation to various events, internal or external to the modules or components. Also, the information sent between various modules can be sent between the modules via at least one of: a data network, the Internet, a voice network, an Internet Protocol network, a wireless device, a wired device and/or via plurality of protocols. Also, the messages sent or received by any of the modules may be sent or received directly and/or via one or more of the other modules.

One skilled in the art will appreciate that a "system" could be embodied as a personal computer, a server, a console, a personal digital assistant (PDA), a cell phone, a tablet computing device, a smartphone or any other suitable computing device, or combination of devices. Presenting the above-described functions as being performed by a "system" is not intended to limit the scope of the present application in any way but is intended to provide one example of many embodiments. Indeed, methods, systems and apparatuses disclosed herein may be implemented in localized and distributed forms consistent with computing technology.

It should be noted that some of the system features described in this specification have been presented as modules, in order to more particularly emphasize their implementation independence. For example, a module may be implemented as a hardware circuit comprising custom very large-scale integration (VLSI) circuits or gate arrays, off-the-shelf semiconductors such as logic chips, transistors, or other discrete components. A module may also be implemented in programmable hardware devices such as field programmable gate arrays, programmable array logic, programmable logic devices, graphics processing units, or the like.

A module may also be at least partially implemented in software for execution by various types of processors. An identified unit of executable code may, for instance, comprise one or more physical or logical blocks of computer instructions that may, for instance, be organized as an object, procedure, or function. Nevertheless, the executables of an identified module need not be physically located together but may comprise disparate instructions stored in different locations which, when joined logically together, comprise the module and achieve the stated purpose for the module. Further, modules may be stored on a computer-readable medium, which may be, for instance, a hard disk drive, flash device, random access memory (RAM), tape, or any other such medium used to store data.

Indeed, a module of executable code could be a single instruction, or many instructions, and may even be distributed over several different code segments, among different programs, and across several memory devices. Similarly, operational data may be identified and illustrated herein within modules and may be embodied in any suitable form and organized within any suitable type of data structure. The operational data may be collected as a single data set or may be distributed over different locations including over different storage devices, and may exist, at least partially, merely as electronic signals on a system or network.

It will be readily understood that the components of the application, as generally described and illustrated in the figures herein, may be arranged and designed in a wide variety of different configurations. Thus, the detailed description of the embodiments is not intended to limit the scope of the application as claimed but is merely representative of selected embodiments of the application.

One having ordinary skill in the art will readily understand that the above may be practiced with steps in a different order, and/or with hardware elements in configurations that are different than those which are disclosed. Therefore, although the application has been described based upon these preferred embodiments, it would be apparent to those of skill in the art that certain modifications, variations, and alternative constructions would be apparent.

While preferred embodiments of the present application have been described, it is to be understood that the embodiments described are illustrative only and the scope of the application is to be defined solely by the appended claims when considered with a full range of equivalents and modifications (e.g., protocols, hardware devices, software platforms etc.) thereto.

What is claimed is:

1. A method comprising
    identifying a calling device number of a calling device from a call placed by the calling device to a call recipient device;
    selecting, based on a call identifier associated with the call, a default enhanced call content profile of a plurality of enhanced call content profiles, assignable to the calling device number and comprising enhanced call content intended for one or more call recipient device numbers identified by the call identifier, wherein the call identifier comprises the calling device number and a client identifier or content provider identifier assigned to the default enhanced call content profile; and
    forwarding enhanced call content associated with the selected enhanced call content profile to the call recipient device associated with one of the call recipient device numbers, wherein the enhanced call content comprises one or more images associated with a primary service entity and one or more images associated with a shared service entity.

2. The method of claim 1, comprising
    determining the call identifier comprises the calling device number and a call recipient device number assigned to the call recipient device; and
    selecting, based on the calling device number and the call recipient device number, the default enhanced call content profile assigned to the call identifier as the selected enhanced call content profile.

3. The method of claim 1, comprising
    determining the call identifier comprises the content provider identifier; and
    selecting, based on the content provider identifier, the default enhanced call content profile assigned to the content provider as the selected enhanced call content profile.

4. The method of claim 1, comprising
    determining the call identifier comprises the client identifier; and
    selecting, based on the content provider identifier, a default profile assigned to the client identifier as the selected enhanced call content profile.

5. The method of claim 1, wherein the selected enhanced call content profile is selected based on newly updated enhanced call content identified in the selected enhanced call content profile since a previous enhanced call content forwarding event.

6. The method of claim 1, comprising
    determining the enhanced call content stored in the selected enhanced call content profile has changed since a last call was made to the call recipient device; and
    forwarding the enhanced call content to the call recipient device.

7. The method of claim 1, wherein one of the plurality of enhanced call content profiles comprises a plurality of calling device numbers which are not assigned to the calling device and one other of the enhanced call content profiles comprises the calling device number, and wherein the calling device number is one of a plurality of calling device numbers assigned to the selected enhanced call content profile.

8. An apparatus comprising
a processor configured to
identify a calling device number of a calling device from a call placed by the calling device to a call recipient device;
select, based on a call identifier associated with the call, a default enhanced call content profile of a plurality of enhanced call content profiles, assignable to the calling device number and comprising enhanced call content intended for one or more call recipient device numbers identified by the call identifier, wherein the call identifier comprises the calling device number and a client identifier or content provider identifier assigned to the default enhanced call content profile; and
forward enhanced call content associated with the selected enhanced call content profile to the call recipient device associated with one of the call recipient device numbers, wherein the enhanced call content comprises one or more images associated with a primary service entity and one or more images associated with a shared service entity.

9. The apparatus of claim 8, comprising
a processor configured to
determine the call identifier comprises the calling device number and a call recipient device number assigned to the call recipient device; and
select, based on the calling device number and the call recipient device number, the default enhanced call content profile assigned to the call identifier as the selected enhanced call content profile.

10. The apparatus of claim 8, wherein the processor is further configured to
determine the call identifier comprises the content provider identifier; and
select, based on the content provider identifier, the default enhanced call content profile assigned to the content provider as the selected enhanced call content profile.

11. The apparatus of claim 8, wherein the processor is further configured to
determine the call identifier comprises the client identifier; and
select, based on the client identifier, the default enhanced call content profile assigned to the client identifier as the selected enhanced call content profile.

12. The apparatus of claim 8, wherein the selected enhanced call content profile is selected based on newly updated enhanced call content identified in the selected enhanced call content profile since a previous enhanced call content forwarding event.

13. The apparatus of claim 8, wherein the processor is further configured to
determine the enhanced call content stored in the selected enhanced call content profile has changed since a last call was made to the call recipient device; and
forward the enhanced call content to the call recipient device.

14. The apparatus of claim 8, wherein one of the plurality of enhanced call content profiles comprises a plurality of calling device numbers which are not assigned to the calling device and one other of the enhanced call content profiles comprises the calling device number, and wherein the calling device number is one of a plurality of calling device numbers assigned to the selected enhanced call content profile.

15. A non-transitory computer readable storage medium configured to store instructions that when executed cause a processor to perform:
identifying a calling device number of a calling device from a call placed by the calling device to a call recipient device;
selecting, based on a call identifier associated with the call, a default enhanced call content profile of a plurality of enhanced call content profiles, assignable to the calling device number and comprising enhanced call content intended for one or more call recipient device numbers identified by the call identifier, wherein the call identifier comprises the calling device number and a client identifier or content provider identifier assigned to the default enhanced call content profile; and
forwarding enhanced call content associated with the selected enhanced call content profile to the call recipient device associated with one of the call recipient device numbers, wherein the enhanced call content comprises one or more images associated with a primary service entity and one or more images associated with a shared service entity.

16. The non-transitory computer readable storage medium of claim 15, wherein the processor is further configured to perform
determining the call identifier comprises the calling device number and a call recipient device number assigned to the call recipient device; and
selecting, based on the calling device number and the call recipient device number, the default enhanced call content profile assigned to the call identifier as the selected enhanced call content profile.

17. The non-transitory computer readable storage medium of claim 15, wherein the processor is further configured to perform
determining the call identifier comprises the content provider identifier; and
selecting, based on the content provider identifier, the default enhanced call content profile assigned to the content provider as the selected enhanced call content profile.

18. The non-transitory computer readable storage medium of claim 15, wherein the processor is further configured to perform
determining the call identifier comprises the client identifier; and
selecting, based on the content provider identifier, a default profile assigned to the client identifier as the selected enhanced call content profile.

19. The non-transitory computer readable storage medium of claim 15, wherein the selected enhanced call content profile is selected based on newly updated enhanced call content identified in the selected enhanced call content profile since a previous enhanced call content forwarding event.

20. The non-transitory computer readable storage medium of claim 15, wherein the processor is further configured to perform
determining the enhanced call content stored in the selected enhanced call content profile has changed since a last call was made to the call recipient device; and forwarding the enhanced call content to the call recipient device.

\* \* \* \* \*